United States Patent
Lee et al.

(10) Patent No.: US 12,469,749 B2
(45) Date of Patent: Nov. 11, 2025

(54) METHOD OF MANUFACTURING SEMICONDUCTOR PACKAGE

(71) Applicant: Samsung Electronics Co., Ltd., Suwon-si (KR)

(72) Inventors: Sang-Won Lee, Seoul (KR); Hyunki Kim, Asan-si (KR); Young-Ja Kim, Cheonan-si (KR); Hyunggil Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 557 days.

(21) Appl. No.: 17/883,250

(22) Filed: Aug. 8, 2022

(65) Prior Publication Data

US 2023/0187285 A1    Jun. 15, 2023

(30) Foreign Application Priority Data

Dec. 14, 2021    (KR) .................. 10-2021-0179114

(51) Int. Cl.
*H01L 21/66* (2006.01)
*H01L 23/00* (2006.01)

(52) U.S. Cl.
CPC .............. *H01L 22/12* (2013.01); *H01L 24/11* (2013.01); *H01L 24/75* (2013.01); *H01L 24/81* (2013.01);

(Continued)

(58) Field of Classification Search
CPC ......... H01L 24/75; H01L 24/81; H01L 24/11; H01L 24/742; H01L 24/02;

(Continued)

(56) References Cited

U.S. PATENT DOCUMENTS

| 5,983,490 | A  | * | 11/1999 | Sakemi | ............ | H01L 21/67271 |
| | | | | | | 257/E23.179 |
| 6,352,189 | B1 | * | 3/2002 | Kobayashi | ........... | B23K 3/0623 |
| | | | | | | 228/8 |

(Continued)

FOREIGN PATENT DOCUMENTS

| JP | 2004319607 A  | 11/2004 |
| KR | 100549301 B1  | 2/2006 |

(Continued)

*Primary Examiner* — Michael M Trinh
(74) *Attorney, Agent, or Firm* — Muir Patent Law, PLLC

(57) ABSTRACT

A method of manufacturing a semiconductor package includes estimating an error in a solder ball attaching process, determining a specification of a ball tool and a method of the solder ball attaching process, based on the estimated error, manufacturing the ball tool according to the determined specification thereof, and performing the solder ball attaching process based on the method of the solder ball attaching process. The determining of the specification of the ball tool and the method of the solder ball attaching process includes determining a number of a plurality of holders in the ball tool and a position and a width of each of the plurality of holders, determining a number of a plurality of working regions of a substrate and a position and a width of each of the plurality of working regions, and dividing a substrate into the plurality of working regions.

19 Claims, 19 Drawing Sheets

(52) U.S. Cl.
CPC .. *H01L 24/742* (2013.01); *H01L 2224/75001* (2013.01); *H01L 2224/75621* (2013.01); *H01L 2224/8118* (2013.01); *H01L 2224/81194* (2013.01); *H01L 2224/81908* (2013.01)

(58) Field of Classification Search
CPC . H01L 2224/75001; H01L 2224/75621; H01L 2224/8118; H01L 2224/81194; H01L 2224/81908; H01L 2224/75735; H01L 2224/81097; H01L 22/12; H01L 21/4853; H01L 21/50
See application file for complete search history.

(56) References Cited

U.S. PATENT DOCUMENTS

| | | | | |
|---|---|---|---|---|
| 6,889,886 | B2 * | 5/2005 | Hazeyama | H01L 24/11 228/246 |
| 2015/0380380 | A1 * | 12/2015 | Schmidt-Lange | B23K 31/12 228/8 |
| 2016/0016247 | A1 * | 1/2016 | An | B23K 1/0016 228/41 |
| 2017/0129032 | A1 | 5/2017 | Kim et al. | |
| 2020/0105553 | A1 * | 4/2020 | Kim | H01L 21/4853 |
| 2020/0108459 | A1 * | 4/2020 | Lee | H05K 3/4007 |
| 2021/0249378 | A1 * | 8/2021 | Oh | B23K 3/0623 |

FOREIGN PATENT DOCUMENTS

| | | |
|---|---|---|
| KR | 101385932 B1 | 4/2014 |
| KR | 101537256 B1 | 7/2015 |
| KR | 101574124 B1 | 12/2015 |
| KR | 101653573 B1 | 9/2016 |
| KR | 1020170054055 A | 5/2017 |

* cited by examiner

METHOD OF MANUFACTURING SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2021-0179114, filed on Dec. 14, 2021, in the Korean Intellectual Property Office, the entire contents of which are hereby incorporated by reference.

BACKGROUND OF THE INVENTION

The present disclosure relates to a method of manufacturing a semiconductor package, and in particular, to a method of manufacturing a semiconductor package using a solder ball attaching process.

A semiconductor package includes a semiconductor chip as a part of an electronic product. In general, the semiconductor package includes a substrate, such as a printed circuit board (PCB), and a semiconductor chip mounted thereon. Solder balls or the like may be used to electrically connect a circuit in the substrate to the outside. The solder balls may be electrically connected to pads formed on a surface of the substrate. With the recent advance in electronic industry, the demand for high-performance, high-speed, and compact electronic components is increasing. Accordingly, it is desirable to reduce a size of the solder ball.

SUMMARY

An embodiment of the inventive concept provides a method of manufacturing a semiconductor package with improved reliability and electrical characteristics.

According to an embodiment of the inventive concept, a method of manufacturing a semiconductor package may include estimating an error in a solder ball attaching process, determining a specification of a ball tool and a method of the solder ball attaching process, based on the estimated error, manufacturing the ball tool according to the determined specification thereof, and performing the solder ball attaching process based on the method of the solder ball attaching process. The determining of the specification of the ball tool and the method of the solder ball attaching process includes determining a number of a plurality of holders in the ball tool and a position and a width of each of the plurality of holders, determining a number of a plurality of working regions of a substrate and a position and a width of each of the plurality of working regions, and dividing a substrate into the plurality of working regions.

According to an embodiment of the inventive concept, a method of manufacturing a semiconductor package may include mounting a semiconductor chip on a first surface of a substrate, forming a plurality of pads on a second surface of the substrate opposite to the first surface, and forming a plurality of solder balls on the plurality of pads, respectively. The forming of the plurality of solder balls includes estimating an error in a solder ball attaching process, determining a specification of a ball tool and a method of the solder ball attaching process, based on the estimated error, manufacturing the ball tool according to the determined specification thereof, performing the solder ball attaching process based on the method of the solder ball attaching process, and evaluating the ball tool. According to the determining of the specification of the ball tool and the method of the solder ball attaching process, the substrate is divided into a first working region and a second working region, and the ball tool comprises a first holder on a first tool region corresponding to the first working region, and a second holder on a second tool region corresponding to the second working region.

DETAILED DESCRIPTION

Example embodiments of the inventive concepts will now be described more fully with reference to the accompanying drawings, in which example embodiments are shown.

Figure 1A:
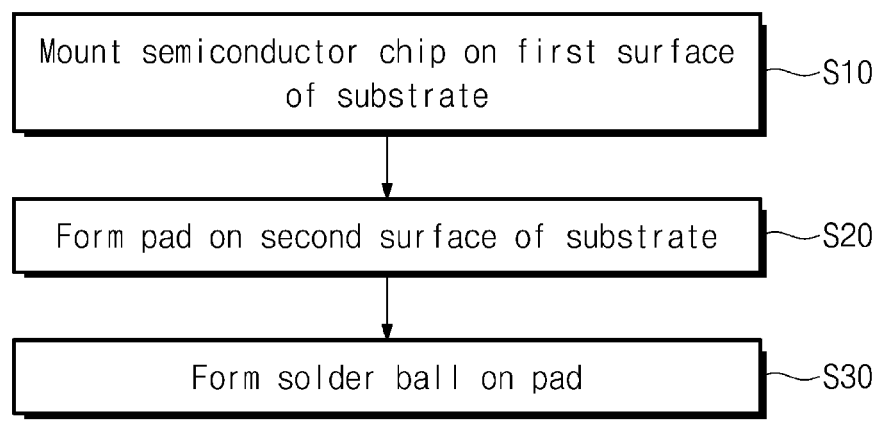
FIGS. 1A and 1B are flow charts illustrating a method of manufacturing a semiconductor package according to an embodiment of the inventive concept.
Figure 1B:
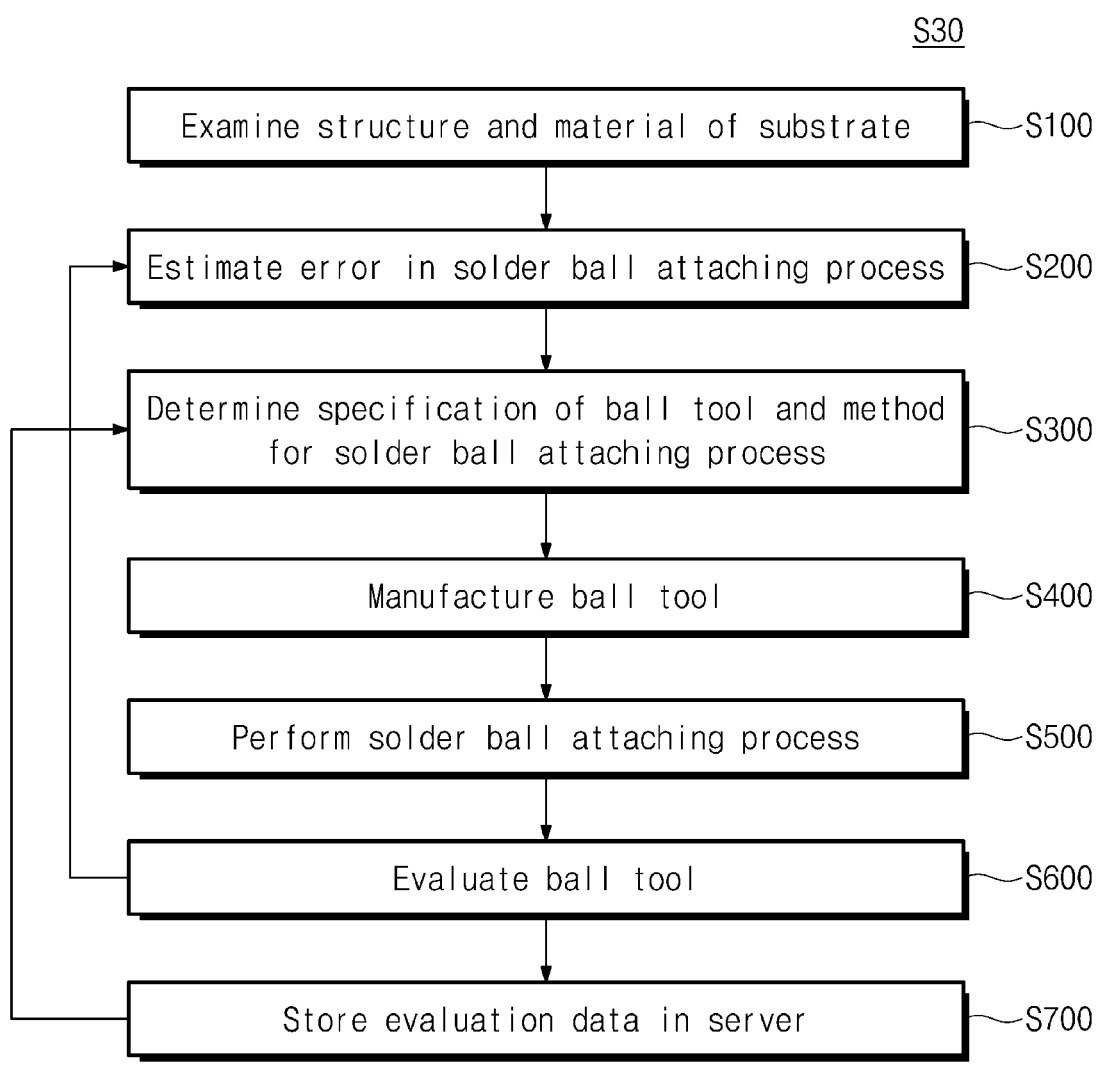

FIGS. 1A and 1B are flow charts illustrating a method of manufacturing a semiconductor package according to an embodiment of the inventive concept.

Referring to FIG. 1A, the method of manufacturing a semiconductor package may include mounting a semiconductor chip on a first surface of a substrate (in S10), forming a pad on a second surface of the substrate (in S20), and forming a solder ball on the pad (in S30). The second surface of the substrate may be a surface opposite to the first surface. The pad and the solder ball may be formed of or include at least one of conductive materials. In an embodiment, the manufacturing method may further include coating the second surface of the substrate with a flux, before the forming of the pad (in S20).

Referring to FIG. 1B, the forming of the solder ball (in S30) in the manufacturing method may include examining a structure and a material of the substrate (in S100), estimating an error in a solder ball attaching process (in S200), determining a specification of a ball tool and a method for the solder ball attaching process (in S300), manufacturing the ball tool (in S400), performing the solder ball attaching process (in S500), evaluating the ball tool, based on a result of the solder ball attaching process (in S600), and storing evaluation data in a server (in S700).

For example, the error in the solder ball attaching process may include a misalignment between the substrate and the ball tool, which may be caused by an expansion/contraction of the substrate and a driving error of the ball tool. The driving error of the ball tool may refer to a degree of a shift from a target alignment of the ball tool.

The determination of the specification of the ball tool and the method for the solder ball attaching process (in S300) may include determining the number of holders of the ball tool and a position and a width of each of the holders and determining the number of the working regions of the substrate and a position and a width of each of the working regions. For example, the determination of the specification of the ball tool may include determining the number of holders of the ball tool and a position and a width of each of the holders, and the method of the solder ball attaching process may include determining the number of the working regions of the substrate and a position and a width of each of the working regions, and dividing a wafer into the plurality of working regions based on the determined number of the working regions and the determined position and width of each working region. The number of the holders of the ball tool may be smaller than or equal to the number of the working regions. For example, the number of the holders of the ball tool may be a value that is obtained by dividing the number of the working regions by an integer that is equal to or greater than 2.

A result, which is obtained through the evaluation of the ball tool (in S600), may be used to calculate the error of the solder ball attaching process (in S200), when the solder ball attaching process is performed on another substrate. For example, the evaluation result of the previous bonding process can be considered in calculation of the error of the solder ball attaching process in the current bonding process. In an embodiment, the result of the evaluation of the ball tool may be based on an error of the performed solder ball attaching process.

The evaluation data stored in the server may be used to determine the specification of the ball tool and the method for the solder ball attaching process (in S300), when the solder ball attaching process is performed on another substrate. In an embodiment, the evaluation data stored in the server may be based on the error of the performed solder ball attaching process.

Figure 2A:
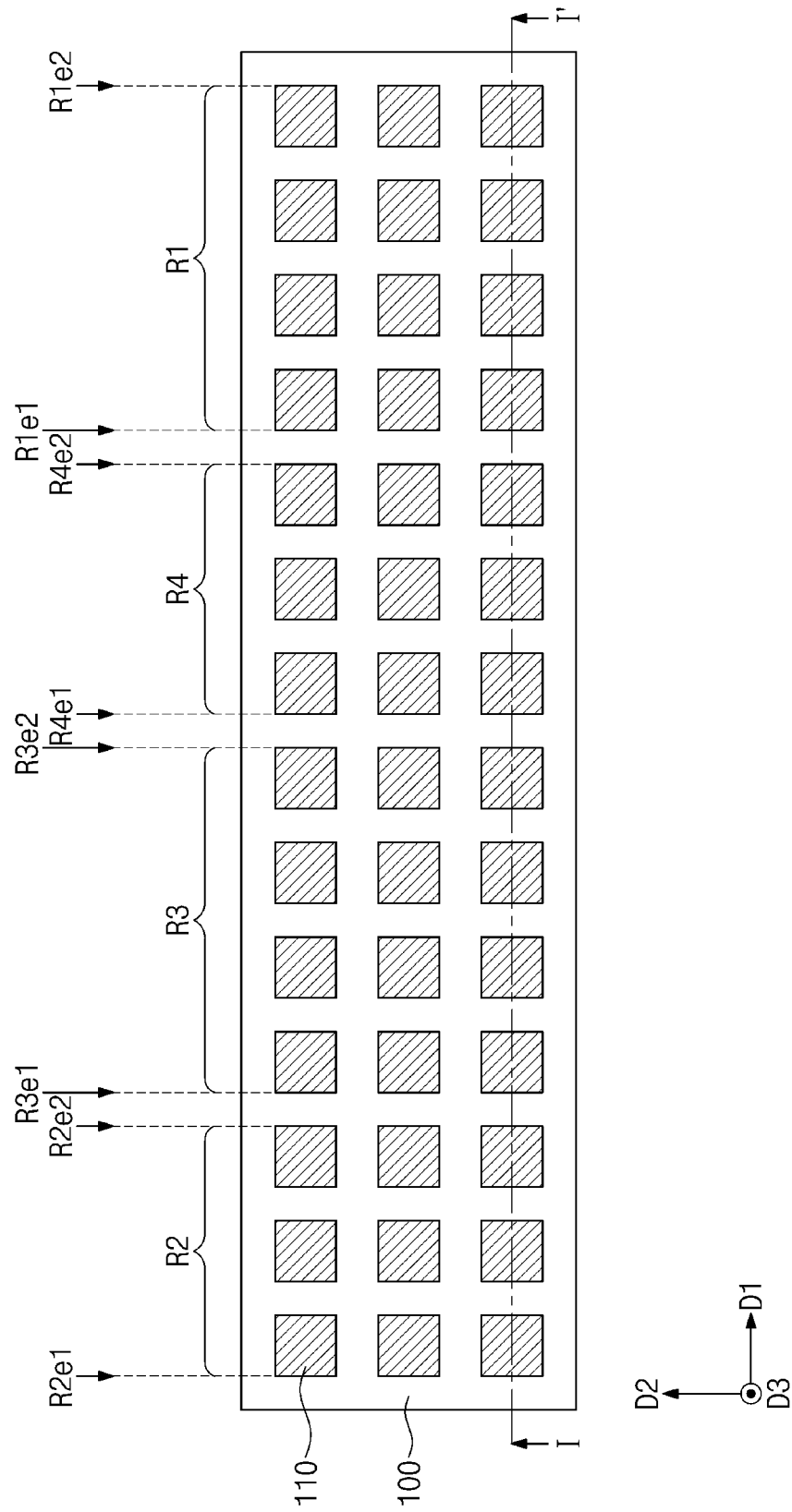
FIG. 2A is a plan view illustrating a substrate, which is used in a process of manufacturing a semiconductor package according to an embodiment of the inventive concept.
Figure 2B:
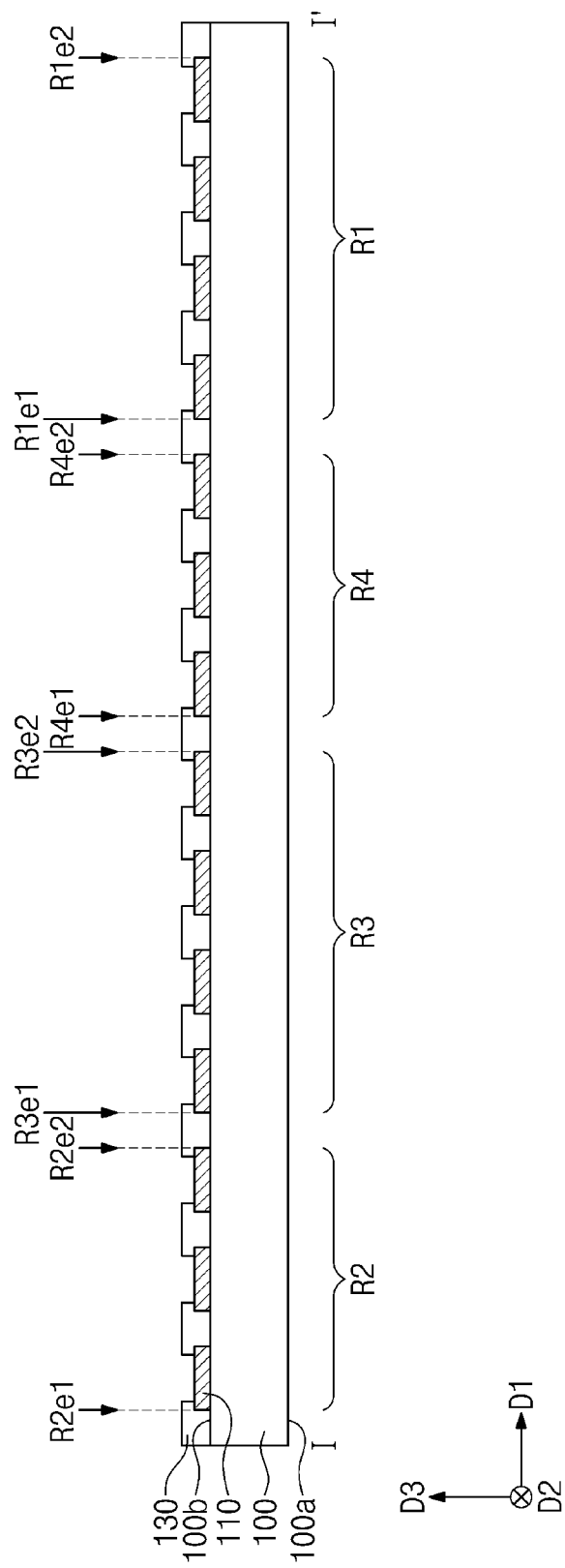
FIG. 2B is a sectional view, which is taken along line I-I' of FIG. 2A to illustrate a substrate, which is used in a process of manufacturing a semiconductor package according to an embodiment of the inventive concept.

FIG. 2A is a plan view illustrating a substrate, which is used in a process of manufacturing a semiconductor package according to an embodiment of the inventive concept. FIG. 2B is a sectional view, which is taken along line I-I' of FIG. 2A to illustrate a substrate, which is used in a process of manufacturing a semiconductor package according to an embodiment of the inventive concept.

Referring to FIGS. 2A and 2B, a semiconductor chip, a mold layer, and interconnection lines may be provided on a first surface 100a of a substrate 100. A plurality of pads 110 and a plurality of insulating patterns 130 may be provided on a second surface 100b of the substrate 100, which is opposite to the first surface 100a in a third direction D3. In an embodiment, the plurality of insulating patterns 130 may be parts of an insulating layer. When viewed in a plan view, the insulating layer may be provided with a plurality of openings exposing the plurality of pads 110, respectively. Each of the first and second surfaces 100a and 100b of the substrate 100 may be a plane that is parallel to a first direction D1 and a second direction D2 and is perpendicular to the third direction D3. In an embodiment, the first to third directions D1, D2, and D3 may be orthogonal to each other.

The pads 110 may be arranged in the first and second directions D1 and D2. For example, the pads 110 may be arranged in an array shape including a plurality of rows, which are extended in the first direction D1 and are spaced apart from each other in the second direction D2, and a plurality of columns, which are extended in the second direction D2 and are spaced apart from each other in the first direction D1. The number of the rows and the number of the columns are not limited to that in the illustrated example. The pads 110 may be electrically connected to the semiconductor chip and/or the interconnection lines on the first surface 100a.

Each of the insulating patterns 130 may be provided to fill a space between the pads 110. Each of the insulating patterns 130 may be provided to partially cover a top surface of each of the pads 110, but the inventive concept is not limited to this example.

As a result of the determining of the method for the solder ball attaching process (in S300 of FIG. 1B), working regions of the substrate 100 may be determined. For example, the substrate 100 may include a first working region R1, a second working region R2, a third working region R3, and a fourth working region R4. The first and second working regions R1 and R2 may be spaced apart from each other in the first direction D1. The third working region R3 may be placed between the first and second working regions R1 and R2. The fourth working region R4 may be placed between the first and third working regions R1 and R3.

A width of the first working region R1 in the first direction D1 may be different from a width of the second working region R2 in the first direction D1. The width of the first working region R1 in the first direction D1 may be substantially equal to a width of the third working region R3 in the first direction D1. The width of the second working region R2 in the first direction D1 may be substantially equal to a width of the fourth working region R4 in the first direction D1. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The number of the working regions of the substrate 100 and the position and width of each of the working regions may depend on a result of the estimation of the error in the solder ball attaching process (in S200 of FIG. 1B) and may not be limited to those in the illustrated example. For example, the substrate 100 may include four or more working regions, and all the working regions of the substrate 100 may have the same width.

To determine the specification of the ball tool and the method for the solder ball attaching process (in S300 of FIG. 1B), a first end portion R1e1 and a second end portion R1e2 of the first working region R1, a first end portion R2e1 and a second end portion R2e2 of the second working region R2, a first end portion R3e1 and a second end portion R3e2 of the third working region R3, and a first end portion R4e1 and a second end portion R4e2 of the fourth working region R4 may be recognized by a pattern recognition system (PRS). In an embodiment, each of the end portions of the working regions may be defined as sidewalls of the outermost ones of the pads 110, which are placed in each of the working regions.

FIGS. 3A to 3D are sectional views illustrating a ball tool, which is used in a process of manufacturing a semiconductor package according to an embodiment of the inventive concept. In the following description of FIGS. 3B, 3C, and 3D, an element previously described with reference to FIG. 3A may be identified by the same reference number without repeating an overlapping description thereof, for concise description.

Figure 3A:
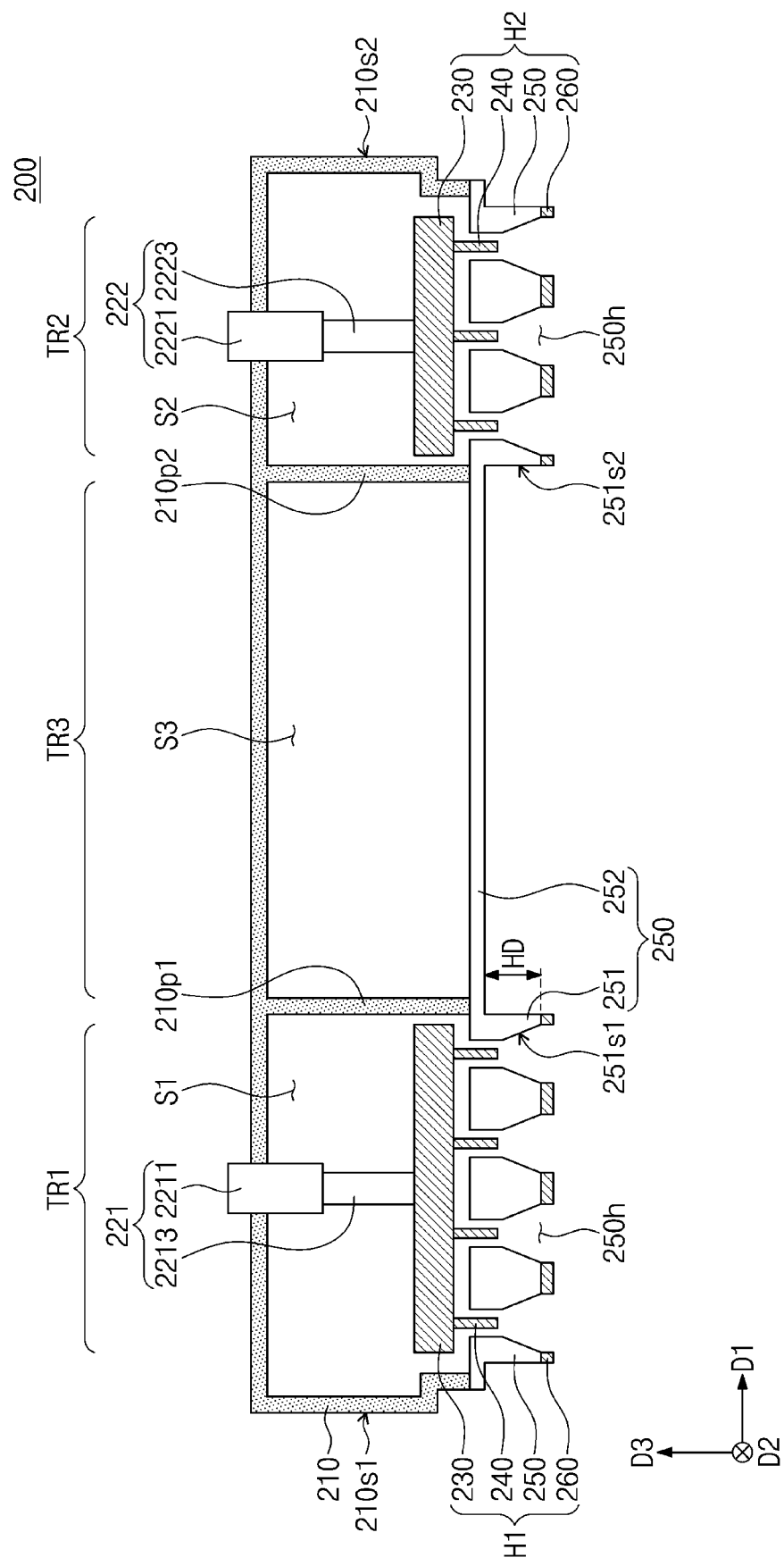
FIGS. 3A to 3D are sectional views illustrating a ball tool, which is used in a process of manufacturing a semiconductor package according to an embodiment of the inventive concept.

Referring to FIG. 3A, a ball tool 200 may include a housing 210, a first driving part 221, a second driving part 222, a first holder H1, and a second holder H2. The ball tool 200 may include a first tool region TR1, in which the first driving part 221 and the first holder H1 are provided, a second tool region TR2, in which the second driving part 222 and the second holder H2 are provided, and a third tool region TR3, which is provided between the first tool region TR1 and the second tool region TR2. A width of the first tool region TR1 in the first direction D1 may be different from a width of the second tool region TR2 in the first direction D1. For example, the width of the first tool region TR1 in the first direction D1 may be larger than the width of the second tool region TR2 in the first direction D1.

A first space S1, which is enclosed by a first sidewall 210s1 of the housing 210 and a first partition wall 210p1 in the housing 210, may be provided in the first tool region TR1. The first driving part 221 and the first holder H1 may be provided in the first space S1. The first sidewall 210s1 of the housing 210 is illustrated to partially have a stepwise shape, but the shape of the first sidewall 210s1 of the housing 210 is not limited to this example.

The first driving part 221 may include a first driving member 2211 and a first driving axis 2213. The first driving member 2211 may be configured to move the first driving axis 2213 in the third direction D3. For example, the first driving member 2211 may include a hydraulic cylinder, a motor, and so forth. The first driving axis 2213 may be extended in the third direction D3 and may be connected to the first holder H1. The first driving axis 2213 may be moved in the third direction D3 by a driving force exerted from the first driving member 2211. The first holder H1 may also be moved along the first driving axis 2213 or in the third direction D3.

The first holder H1 may include a pressing plate 230, which is coupled to the first driving member 2211 of the first driving part 221, pins 240, which are provided below the pressing plate 230, a suction plate 250, which is connected to the housing 210 and has suction holes 250h, and a guide member 260, which is provided below the suction plate 250 and is configured to guide movement paths of solder balls, and here, the suction holes 250h may be configured such that the pins 240 can be moved therethrough. For example, each pin of the pins 240 may move in a corresponding suction hole of the suction holes 250h.

The pressing plate 230 and the pins 240 may be moved in the third direction D3 by the first driving part 221, and the pins 240 may be moved into the suction holes 250h. A size (i.e., a width in the first direction D1 and a thickness in the third direction D3) of the pressing plate 230 and a position (i.e., within the suction holes 250h) of each of the pins 240 may be adjusted, if necessary.

An inner sidewall 251s1 of the suction plate 250 defining the suction holes 250h may be a surface that is inclined at an angle relative to the third direction D3. An outer sidewall 251s2 of the suction plate 250 may be a surface that is parallel to the third direction D3. For example, the outer sidewall 251s2 of the suction plate 250 may be orthogonal to a bottom surface of a second portion 252 of the suction plate 250.

A second space S2, which is enclosed a second sidewall 210s2 of the housing 210 and a second partition wall 210p2 in the housing 210, may be provided in the second tool region TR2. The second driving part 222 and the second holder H2 may be provided in the second space S2. The second sidewall 210s2 of the housing 210 is illustrated to have a stepwise portion at a specific region, but the shape of the second sidewall 210s2 of the housing 210 is not limited to that in the illustrated example.

The second driving part 222 may include a second driving member 2221 and a second driving axis 2223. The second driving member 2221 and the second driving axis 2223 of the second driving part 222 may have substantially the same structure as the first driving member 2211 and the first driving axis 2213 of the first driving part 221.

The second holder H2 may have substantially the same structure as the first holder H1. However, a width of the second holder H2 in the first direction D1 may be different from the width of the first holder H1 in the first direction D1. For example, the width of the second holder H2 in the first direction D1 may be smaller than the width of the first holder H1 in the first direction D1. However, the inventive concept is not limited to this example, and in an embodiment, the width of the first holder H1 in the first direction D1 may be substantially equal to the width of the second holder H2 in the first direction D1.

The suction plate 250 may include a first portion 251, which is provided in the first or second tool region TR1 or TR2, and the second portion 252, which is provided in the third tool region TR3 and is extended from the first portion 251 in the first direction D1. A bottom surface of the first portion 251 and a bottom surface of the second portion 252 may be located at different levels from each other. For example, the bottom surfaces of the first and second portions 251 and 252 may be provided to have a height difference HD, and in an embodiment, the height difference HD may be between about 150 μm and about 250 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A third space S3, which is enclosed by the first and second partition walls 210p1 and 210p2 in the housing 210, may be provided in the third tool region TR3. The second portion 252 of the suction plate 250 may be provided in a lower portion of the third space S3. A driving part and a holder may not be provided in the third space S3, but the inventive concept is not limited to this example.

The first tool region TR1 of the ball tool 200 may correspond to the first and third working regions R1 and R3 of the substrate 100 as described with reference to FIGS. 2A and 2B. For example, the first tool region TR1 of the ball tool 200 may be aligned to one of the first and third working regions R1 and R3 of the substrate 100 as described with reference to FIGS. 2A and 2B in the solder ball attaching process (S500). In an embodiment, a width of the first holder H1 of the first tool region TR1 in the first direction D1 may be substantially equal to a width of each of the first and third working regions R1 and R3 of the substrate 100 in the first direction D1. The second tool region TR2 of the ball tool 200 may correspond to the second and fourth working regions R2 and R4 of the substrate 100 as described with reference to FIGS. 2A and 2B. For example, the second tool region TR2 of the ball tool 200 may be aligned to one of the second and fourth working regions R2 and R4 of the substrate 100 as described with reference to FIGS. 2A and 2B in the solder ball attaching process (S500). In an embodiment, a width of the second holder H2 of the second tool region TR2 in the first direction D1 may be substantially equal to a width of each of the second and fourth working regions R2 and R4 of the substrate 100 in the first direction D1.

In an embodiment, the ball tool 200 may further include heating/cooling parts, which are configured to independently control temperatures of respective regions below the first to third tool regions TR1, TR2, and TR3. The heating/cooling parts may be provided at respective positions corresponding to the first to third tool regions TR1, TR2, and TR3.

The ball tool 200 may have different structures and shapes, depending on the results, which are obtained through the estimation of the error in the solder ball attaching process (in S200 of FIG. 1B) and the determination of the specification of the ball tool and the method for the solder ball attaching process (in S300), and positions of end portions of the working regions, which are recognized by the pattern recognition system (PRS).

Figure 3B:
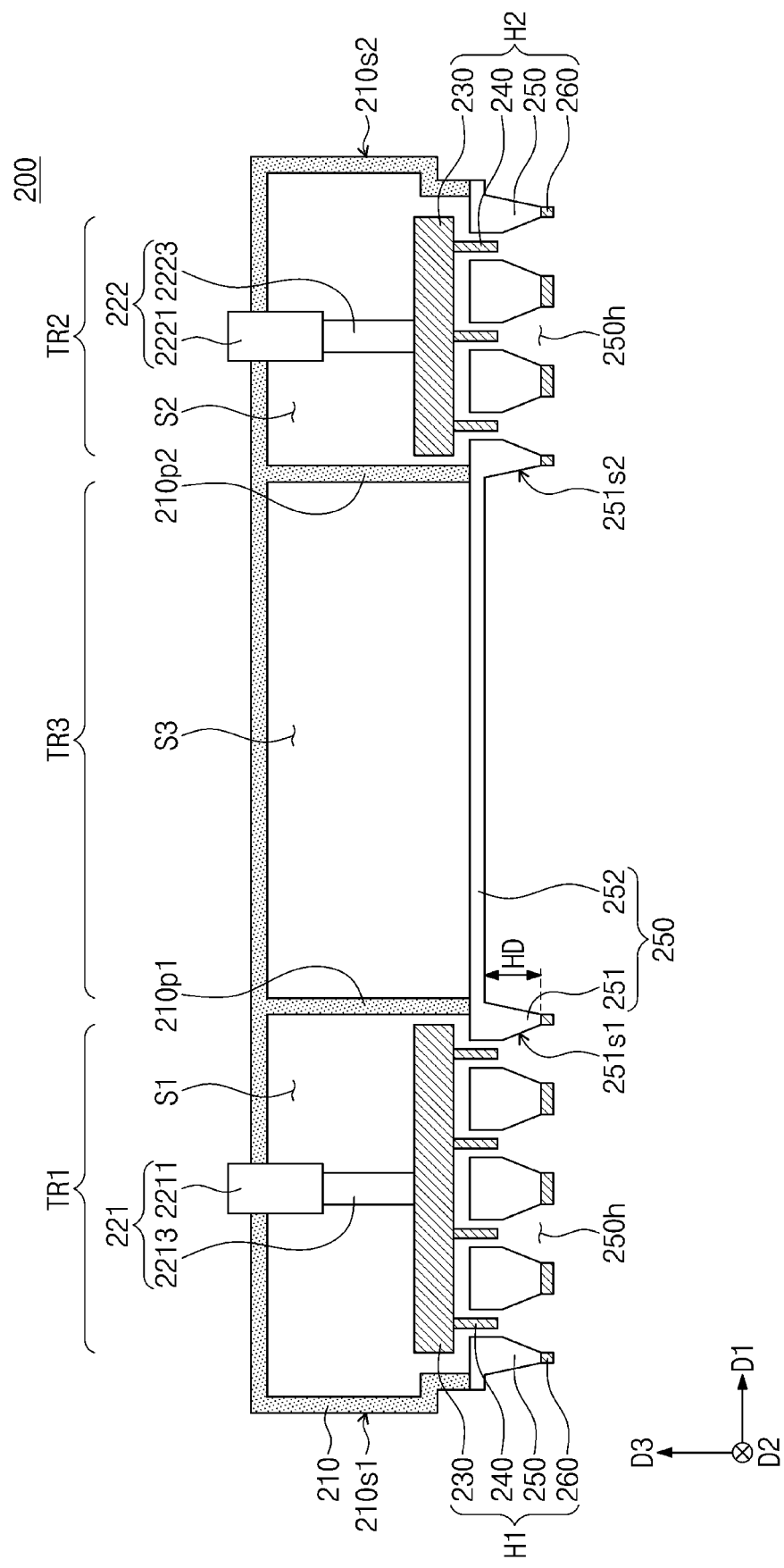

Referring to FIG. 3B, the outer sidewall 251s2 of the suction plate 250 may be a surface that is inclined at an angle relative to the third direction D3. The angle of the outer sidewall 251s2 of the suction plate 250 relative to the third direction D3 may be different from the angle of the inner sidewall 251s1 of the suction plate 250 relative to the third direction D3. As an example, the angle of the outer sidewall 251s2 of the suction plate 250 relative to the third direction D3 may be smaller than the angle of the inner sidewall 251s1 of the suction plate 250 to the third direction D3.

Figure 3C:
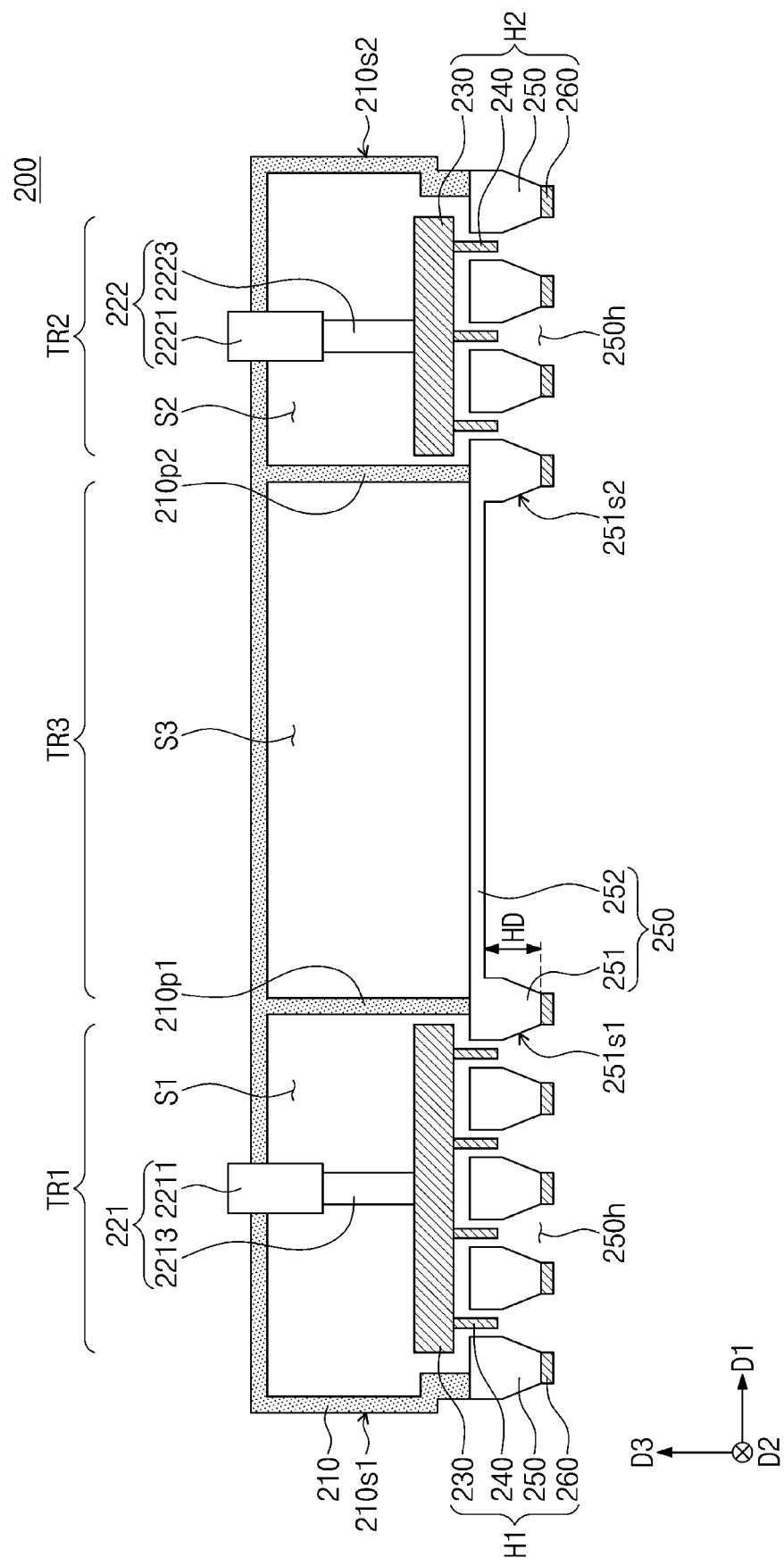

Referring to FIG. 3C, a portion of the outer sidewall 251s2 of the suction plate 250 may be a surface that is inclined at an angle relative to the third direction D3. Another portion of the outer sidewall 251s2 of the suction plate 250 may be a surface that is parallel to the third direction D3. The angle of the portion of the outer sidewall 251s2 of the suction plate 250 relative to the third direction D3 may be substantially equal to the angle of the inner sidewall 251s1 of the suction plate 250 relative to the third direction D3.

Figure 3D:
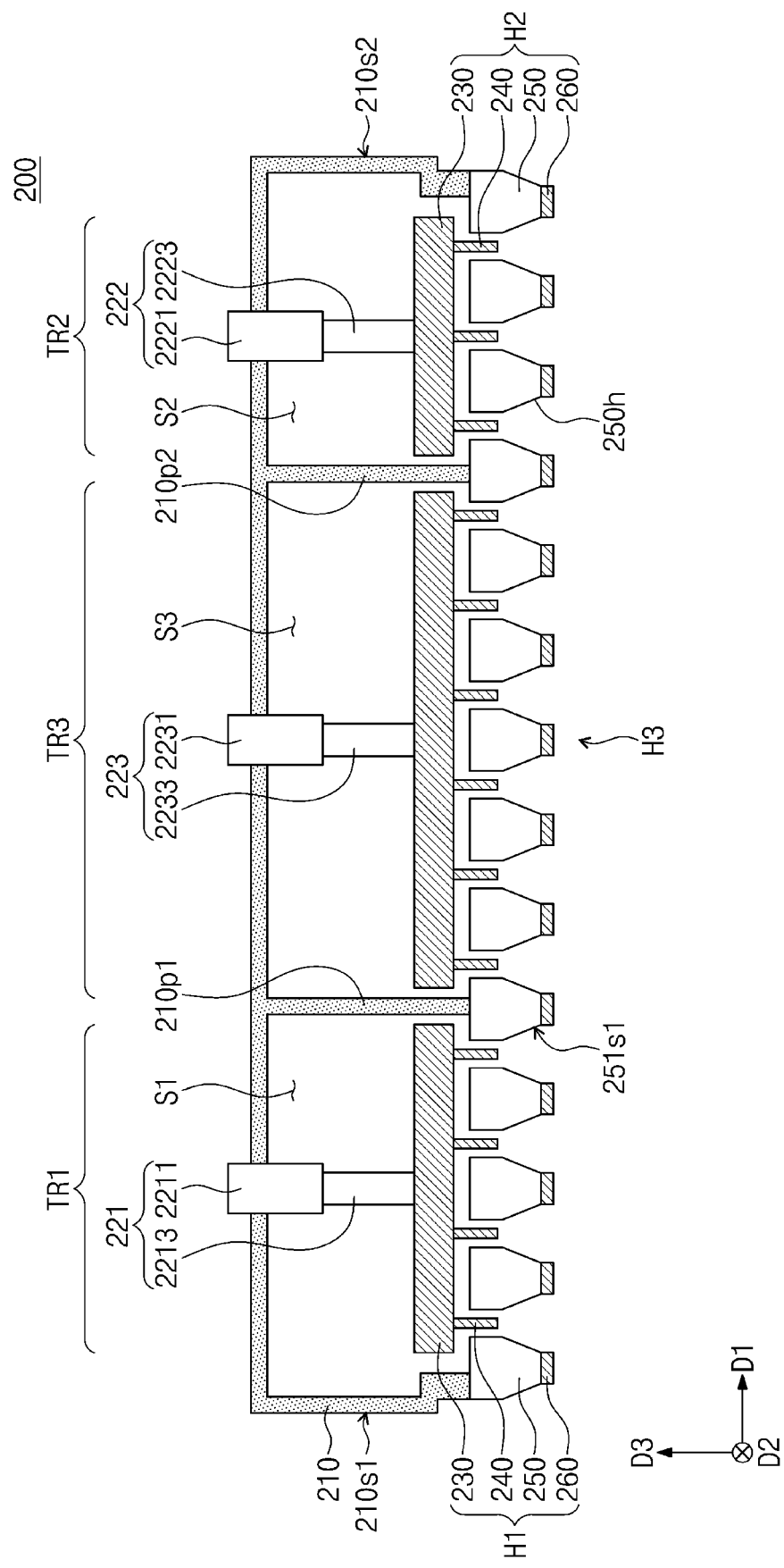

Referring to FIG. 3D, the third space S3, which is enclosed by the first and second partition walls 210p1 and 210p2 in the housing 210, may be provided in the third tool region TR3, and a third driving part 223 and a third holder H3 may be provided in the third space S3. A width of the third holder H3 in the first direction D1 may be different from a width of each of the first and second holders H1 and H2 in the first direction D1.

The third driving part 223 may include a second driving member 2231 and a second driving axis 2233. The second driving member 2231 and the second driving axis 2233 of the third driving part 223 may have substantially the same structure as the driving member and the driving axis of each of the first and second driving parts 221 and 222. Each of the first to third driving parts 221, 222, and 223 may be independently controlled. Each of the first to third driving parts 221, 222, and 223 is illustrated to be located on a center axis of a corresponding one of the first to third holders H1, H2, and H3, but in an embodiment, a position of each of the first to third driving parts 221, 222, and 223, which are respectively connected to the first to third holders H1, H2, and H3, is not limited to that in the illustrated example.

Figure 4A:
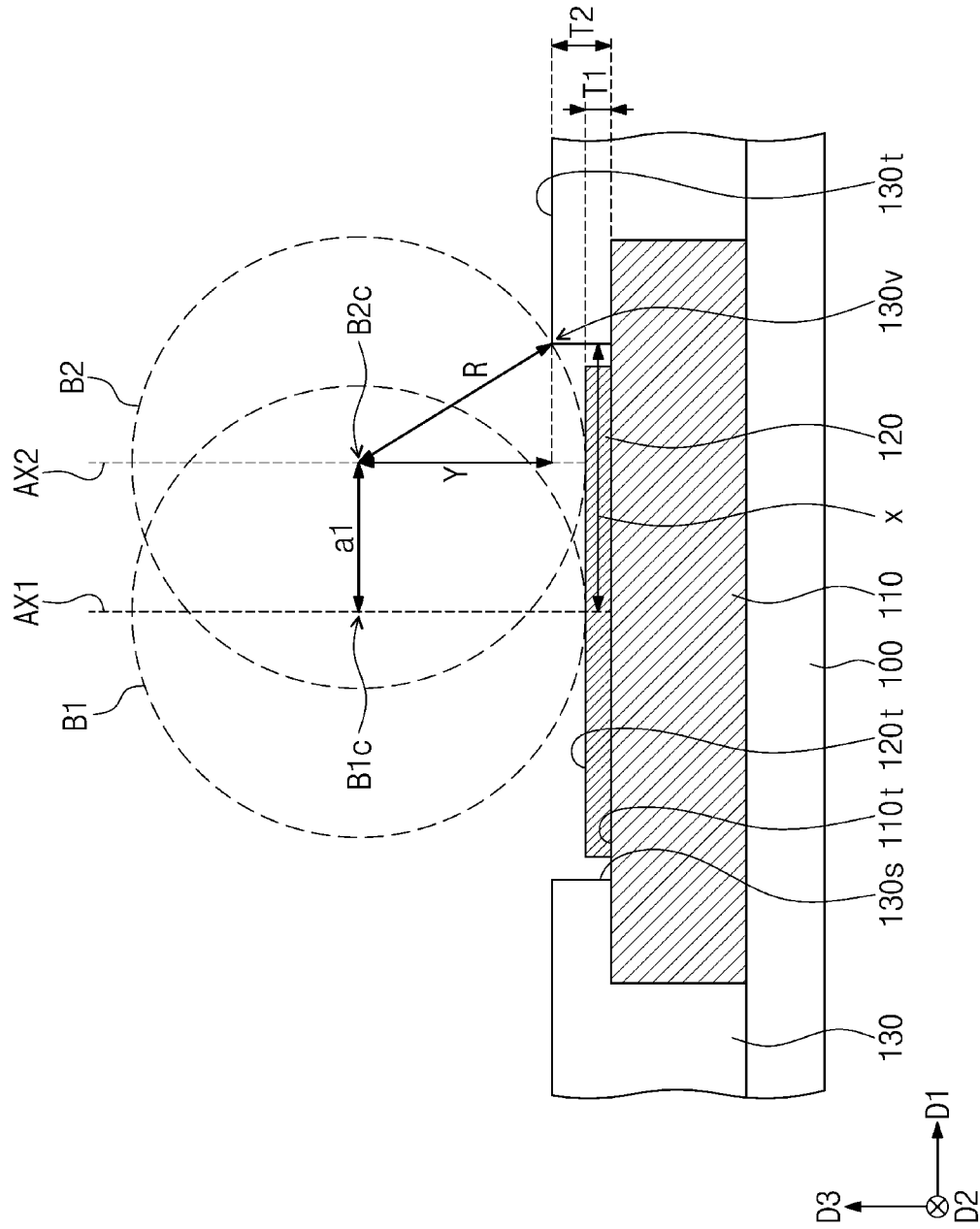
FIGS. 4A, 4B, and 4C describe a method of estimating an error in a solder ball attaching process, which is performed as a part of a process of manufacturing a semiconductor package according to an embodiment of the inventive concept.
Figure 4B:
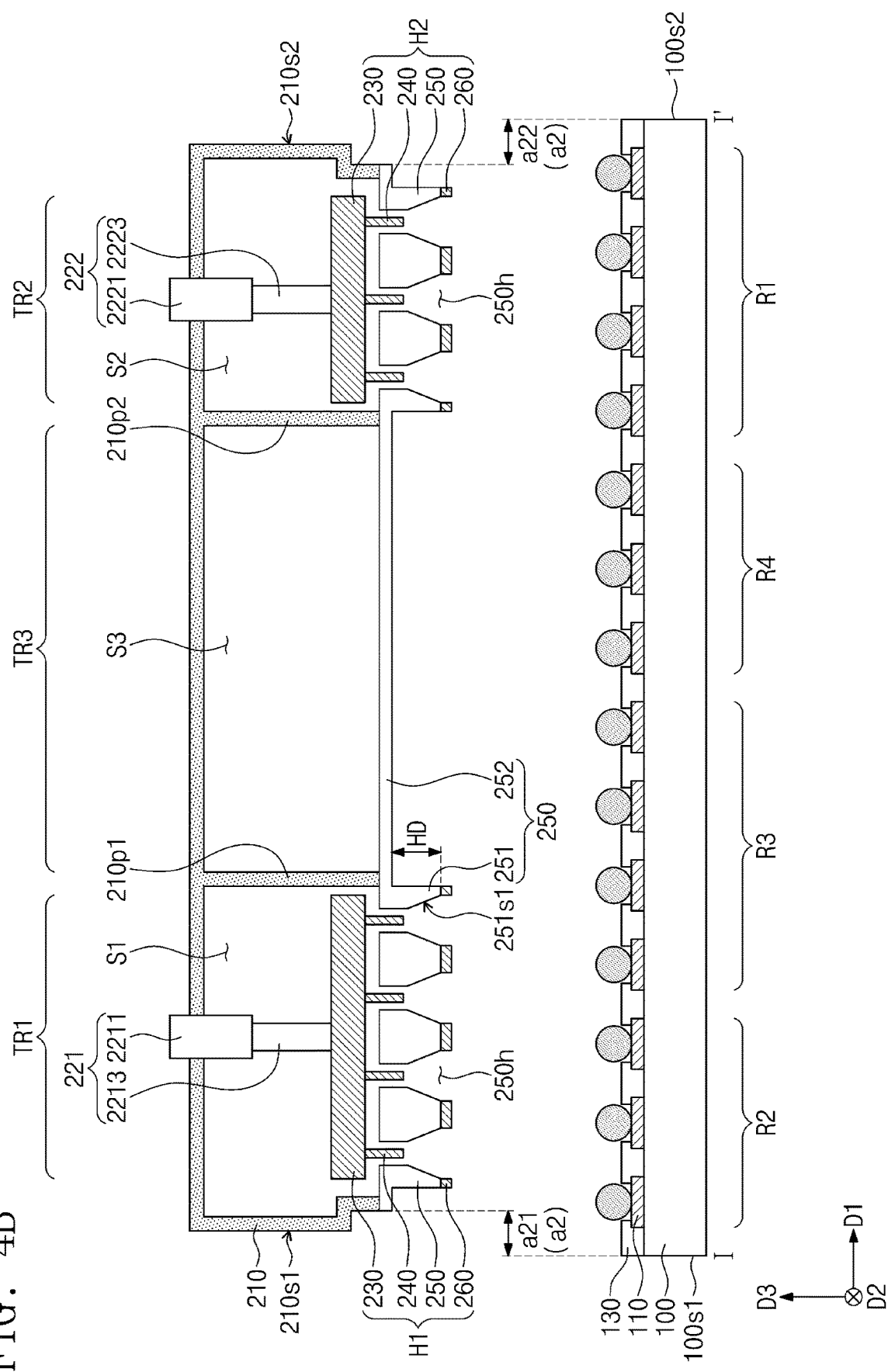
Figure 4C:
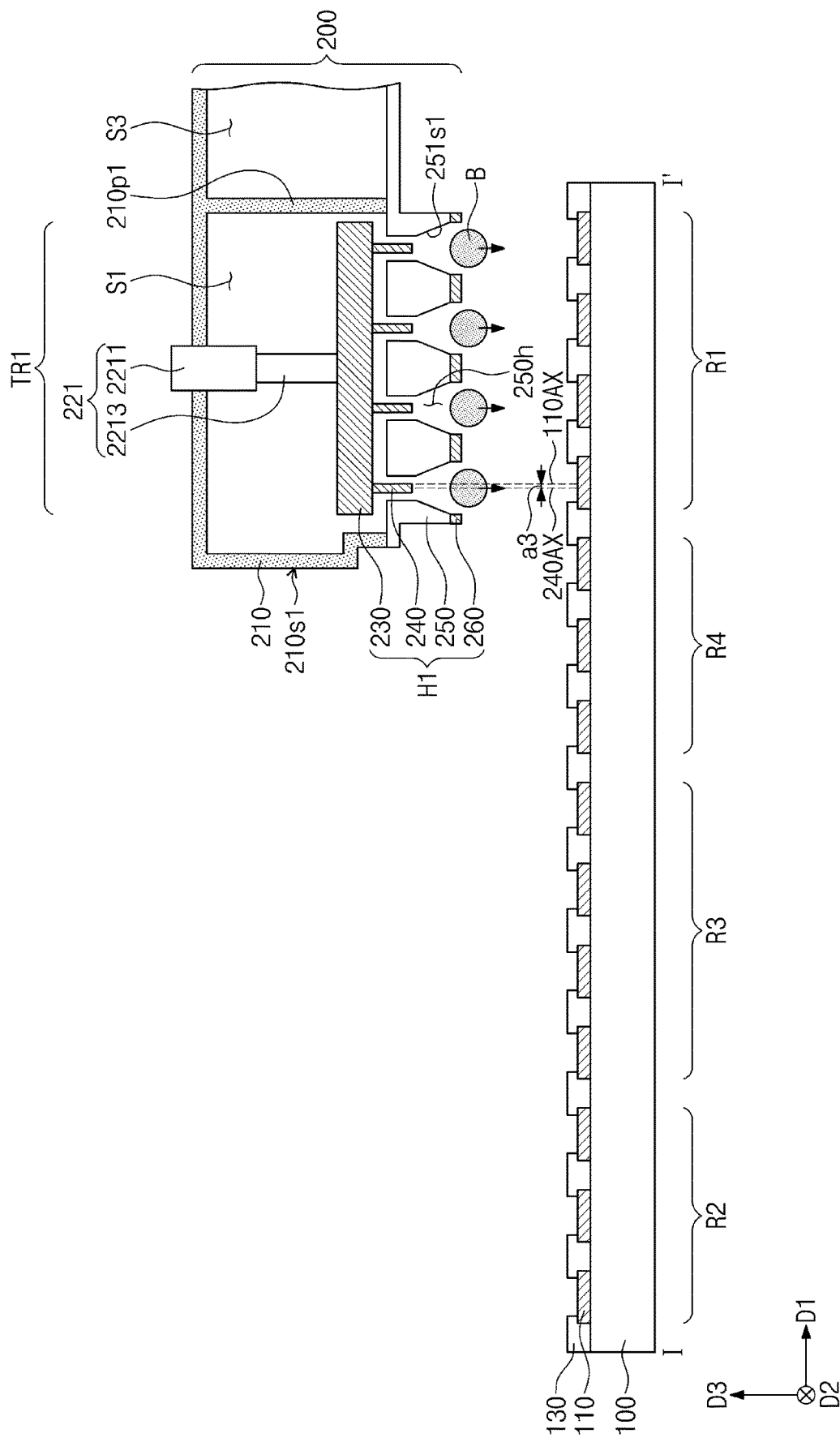

FIGS. 4A, 4B, and 4C are conceptual diagrams illustrating a method of estimating an error in a solder ball attaching process, which is performed as a part of a process of manufacturing a semiconductor package according to an embodiment of the inventive concept.

Referring to FIG. 4A, a first ball image B1 and a second ball image B2 may be virtual ball images, which are used to calculate a first error a1. A radius of the first ball image B1 may be equal to a radius of the second ball image B2. The first ball image B1 may have a spherical shape and may have a first axis AX1 as its center axis, and the second ball image B2 may have a spherical shape and may have a second axis AX2 as its center axis. The first axis AX1 may coincide with a center axis of the pad 110 and a center axis of an auxiliary pad 120, and the second axis AX2 may be spaced apart from the first axis AX1 in the first direction D1 by the first error a1. The second ball image B2 may be in contact with a vertex 130v of the insulating pattern 130.

The first error a1 may be defined as a distance between a center B1c of the first ball image B1 and a center B2c of the second ball image B2 and may be calculated by the following [formula 1]. The first error a1 may be a tolerance in position of a solder ball, which is allowed for an electric connection between the solder ball and the pad 110.

$$a1 = X - \sqrt{R^2 - Y^2}, Y = R - (T2 - T1),$$ [Formula 1]

where X is a distance between the first axis AX1 and an inner sidewall 130s of an opening of the insulating pattern 130 in the first direction D1, R is a radius of each of the first and second ball images B1 and B2, T2 is a height difference between a top surface 130t of the insulating pattern 130 and a top surface 110t of the pad 110 in the third direction D3, and T1 is a height difference between a top surface 120t of the auxiliary pad 120 and the top surface 110t of the pad 110 in the third direction D3. The opening of the insulating pattern 130 may expose the auxiliary pad 120 and a portion of the top surface 110t of the pad 110.

Referring to FIG. 4B, a first sidewall 100s1 of the substrate 100 may be spaced apart from the first sidewall 210s1 of the housing 210 of the ball tool 200 in the first direction D1 by a first offset a21. A second sidewall 100s2 of the substrate 100 may be spaced apart from the second sidewall 210s2 of the housing 210 of the ball tool 200 in the first direction D1 by a second offset a22. The first and second sidewalls 210s1 and 210s2 of the housing 210 of the ball tool 200 may be measured on the basis of a portion aligned to an outer sidewall of the suction plate 250. A second error a2 may be defined as a mean value of the first and second offsets a21 and a22. In an embodiment, the second error a2 may be a value of the sum of the first and second offsets a21 and a22 divided by 2.

After a die bonding process (i.e., the mounting of the semiconductor chip on the substrate 100) (in S10 of FIG. 1A) and the solder ball attaching process, the substrate 100 may be expanded or contracted by various thermal processes, and in this case, the substrate 100 may be misaligned from the ball tool 200. In addition, a plurality of the substrates 100, on which the solder ball attaching process is performed, may have a non-negligible width dispersion in the first direction D1. For example, the second error a2 may be an error that is caused by the expansion/contraction-induced misalignment between the substrate 100 and the ball tool 200 and the non-negligible width dispersion of the substrates 100.

Referring to FIG. 4C, during the solder ball attaching process, the ball tool 200 may be moved in the first direction D1, and in this case, a third error a3 may occur. The third error a3 may be defined as a distance between a center axis 110AX of one of the pads 110 and a center axis 240AX of a corresponding one of the pins 240 of the first holder H1. Each of the solder balls B may be moved along the center axis 240AX of each of the pins 240 and in the third direction D3 and then may be attached to a position that is deviated from the center axis 110AX of each of the pads 110 by the third error a3. For example, the third error a3 may be an error that is caused by a driving error of the ball tool 200 and a consequent misalignment between the substrate 100 and the ball tool 200.

Referring to FIGS. 1B, 4A, 4B, and 4C, the estimating of the error in the solder ball attaching process (in S200) may include predicting and/or calculating the first to third errors a1, a2, and a3. The determining of the specification of the ball tool 200 and the method for the solder ball attaching process (in S300) may include examining whether the first to third errors a1, a2, and a3 satisfy the following [formula 2].

$$a1 < a2 + a3 \quad \text{[Formula 2]}$$

For example, in the case where Formula 2 is not satisfies (i.e., the first error a1 is smaller than or equal to a sum of the second and third errors a2 and a3), the working regions of the substrate 100 may be subdivided or may be divided into smaller working regions, and the tool regions of the ball tool 200 and the structure of the holders may be re-designed based on the subdivided working regions.

The determining of the specification of the ball tool 200 and the method for the solder ball attaching process (in S300) may include determining the number of the solder ball attaching processes (i.e., the number of the working regions) by comparing the first error a1 with an expectation value of the expansion/contraction of the substrate 100. For example, the number n of the solder ball attaching processes may be determined by the following Formula 3. For example, the number n may represent how many times a solder ball attaching process is performed.

$$n = [(\text{expectation value of expansion/contraction of substrate})/(\text{first error } a1)], \quad \text{[Formula 3]}$$

Here, a square bracket of x, [x], means a greatest integer function yielding the largest value of integers smaller than or equal to a given real number x or [x] may return the integer part of a value x by removing the fractional digits. For example, if a value of (expectation value of expansion/contraction of substrate)/(first error a1) is 3.2, n is equal to 3. In other words, n is a truncated integer of the value of (expectation value of expansion/contraction of substrate)/(first error a1).

In an embodiment, the number n of the solder ball attaching processes may be given by [(expectation value of expansion/contraction of substrate)/(first error a1)]+1 (times).

FIGS. 5A, 5B, 5C, 5D, and 5E are sectional views illustrating a solder ball attaching process, which is performed as a part of a process of manufacturing a semiconductor package according to an embodiment of the inventive concept.

Figure 5A:
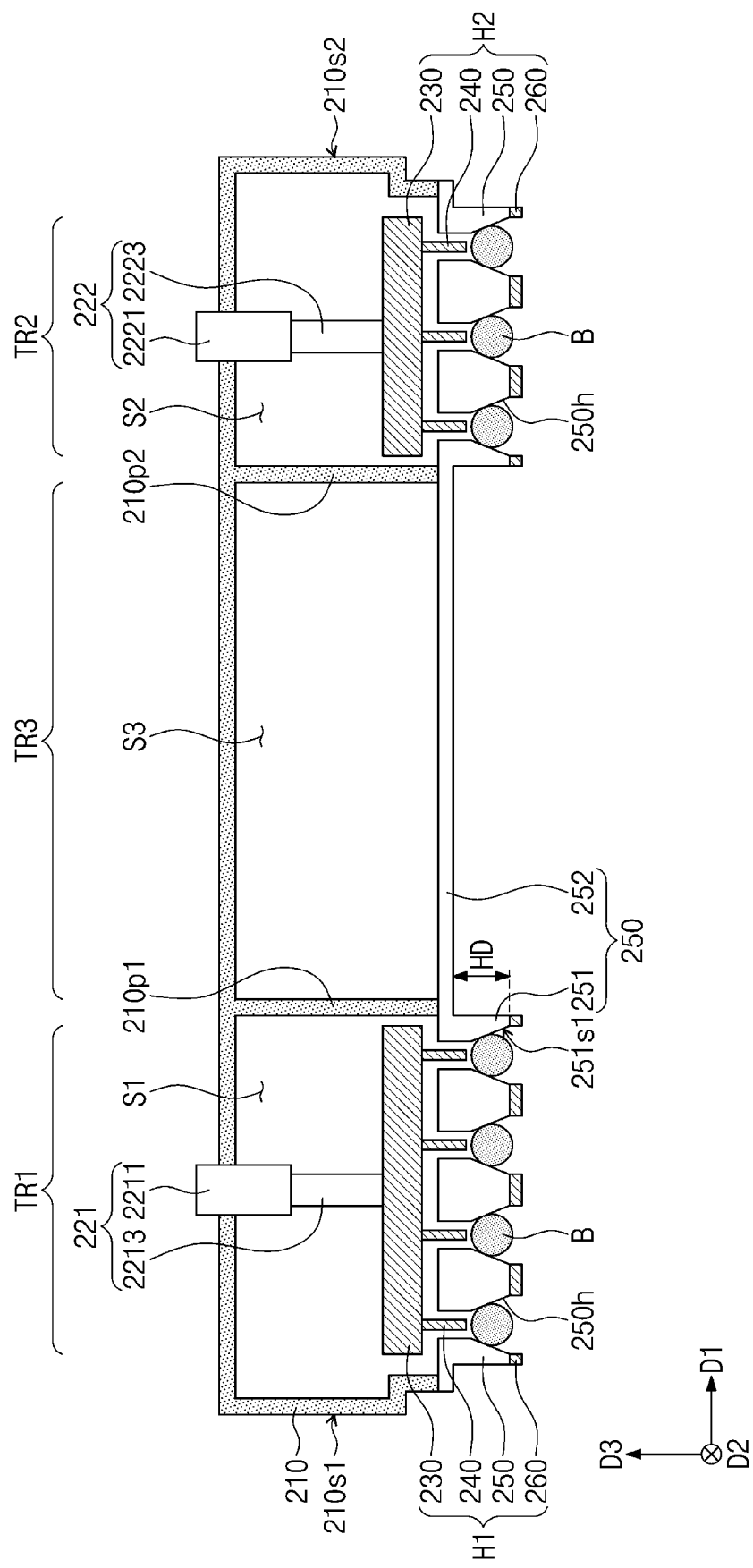
FIGS. 5A, 5B, 5C, 5D, and 5E are sectional views illustrating a solder ball attaching process, which is performed as a part of a process of manufacturing a semiconductor package according to an embodiment of the inventive concept.

Referring to FIG. 5A, the solder balls B may be contained in the suction holes 250h of the suction plate 250 of the ball tool 200. The solder balls B may be suctioned into the suction holes 250h by a difference in pressure between each of the first and second spaces S1 and S2 and the outside, thereby being in contact with the inner sidewall 251s1 of the suction plate 250.

In an embodiment, the suctioning of the solder balls B into the suction holes 250h may include inverting the ball tool 200 (i.e., turning the ball tool 200 upside down) such that a bottom surface 200b of the ball tool 200 faces the third direction D3 or faces upward, providing a vacuum pressure to the first space S1, the second space S2, and the suction holes 250h connected thereto using a vacuum pump and supplying (e.g., dropping) the solder balls B from a ball supplier to the suction holes 250h.

In an embodiment, the suctioning of the solder balls B into the suction holes 250h may include placing the ball tool 200 over a ball jumping device including a vibrating container, providing a vacuum pressure to the first space S1, the second space S2, and the suction holes 250h connected thereto using a vacuum pump, and vibrating the vibrating container to supply the solder balls B into the suction holes 250h.

Figure 5B:
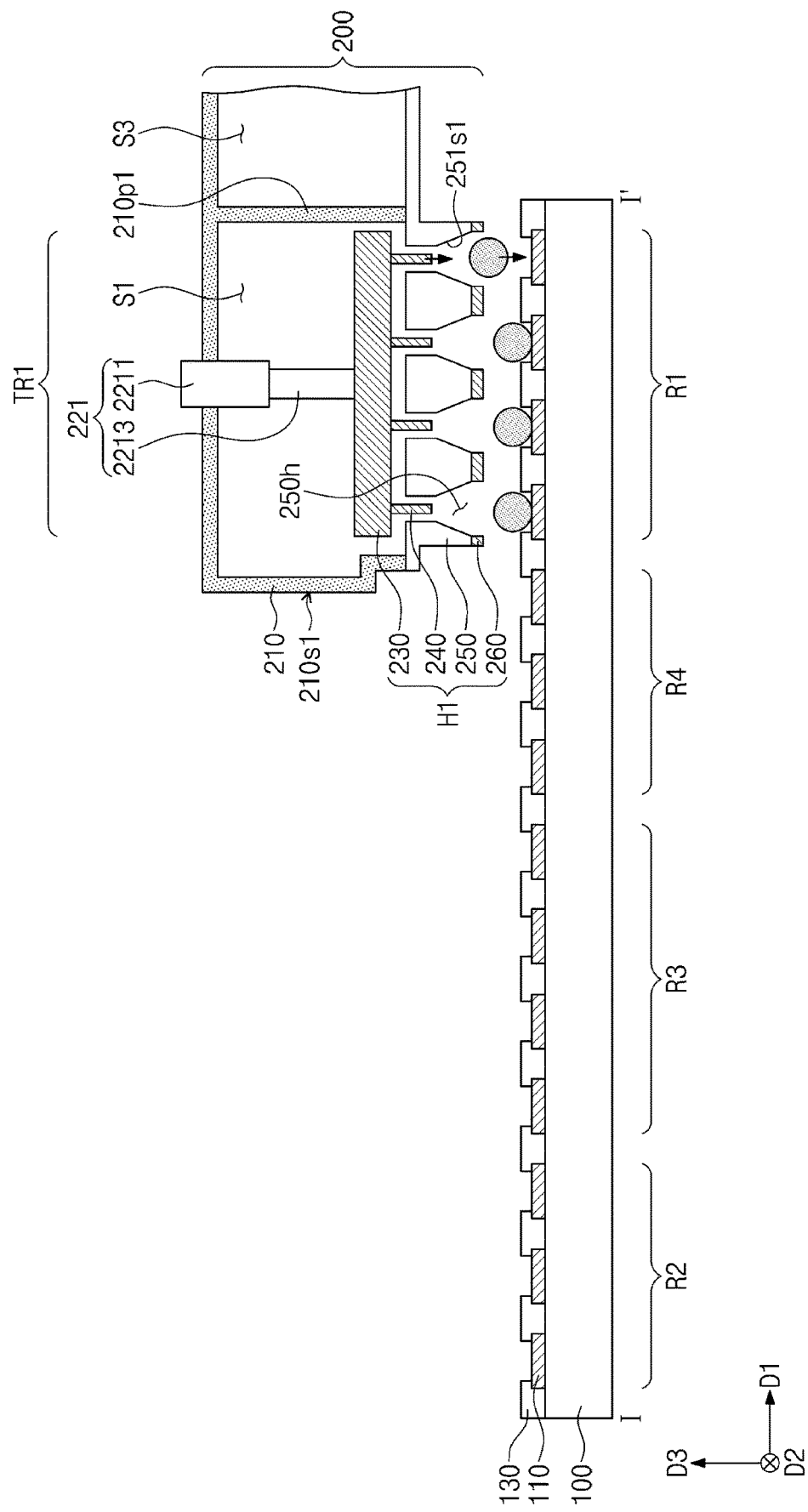

Referring to FIG. 5B, the first solder ball attaching process may be performed on the first working region R1 of the substrate 100. The first solder ball attaching process may include moving the ball tool 200 in the first direction D1 such that the first tool region TR1 of the ball tool 200 overlaps the first working region R1 of the substrate 100 in the third direction D3 and then driving the first driving part 221 to move the pressing plate 230 and the pins 240 of the first holder H1 in a downward direction. Accordingly, the solder balls B may be attached to the pads 110 of the first working region R1.

During the first solder ball attaching process, the fourth working region R4 of the substrate 100, which is adjacent to the first working region R1 in the first direction D1, may not overlap the ball tool 200 in the third direction D3. During the first solder ball attaching process, the first working region R1 may have a temperature different from the second, third, and fourth working regions R2, R3, and R4. For example, the temperature of the first working region R1 may be higher than temperatures of the second, third, and fourth working regions R2, R3, and R4.

Figure 5C:
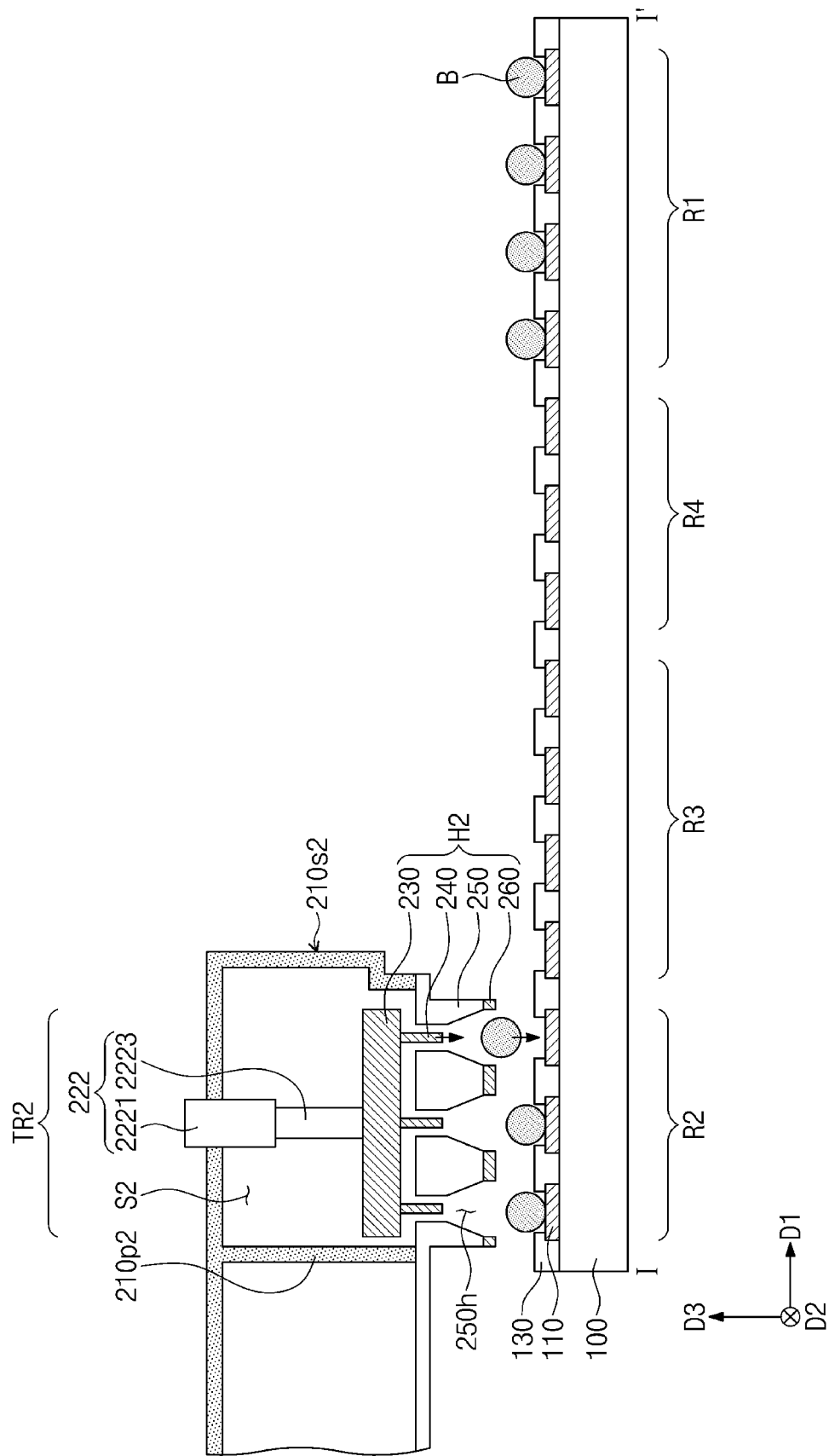

Referring to FIG. 5C, the second solder ball attaching process may be performed on the second working region R2 of the substrate 100. The second solder ball attaching process may include moving the ball tool 200 in the first direction D1 such that the second tool region TR2 of the ball tool 200 overlaps the second working region R2 in the third direction D3, after the first solder ball attaching process, and then driving the second driving part 222 to move the pressing plate 230 and the pins 240 of the second holder H2 in a downward direction. Accordingly, the solder balls B may be attached to the pads 110 of the second working region R2.

During the second solder ball attaching process, the third working region R3 of the substrate 100, which is adjacent to the second working region R2 in the first direction D1, may not overlap the ball tool 200 in the third direction D3. During the second solder ball attaching process, the second working region R2 may have a temperature different from the first, third, and fourth working regions R1, R3, and R4. For example, the temperature of the second working region R2 may be higher than temperatures of the first, third, and fourth working regions R1, R3, and R4.

Figure 5D:
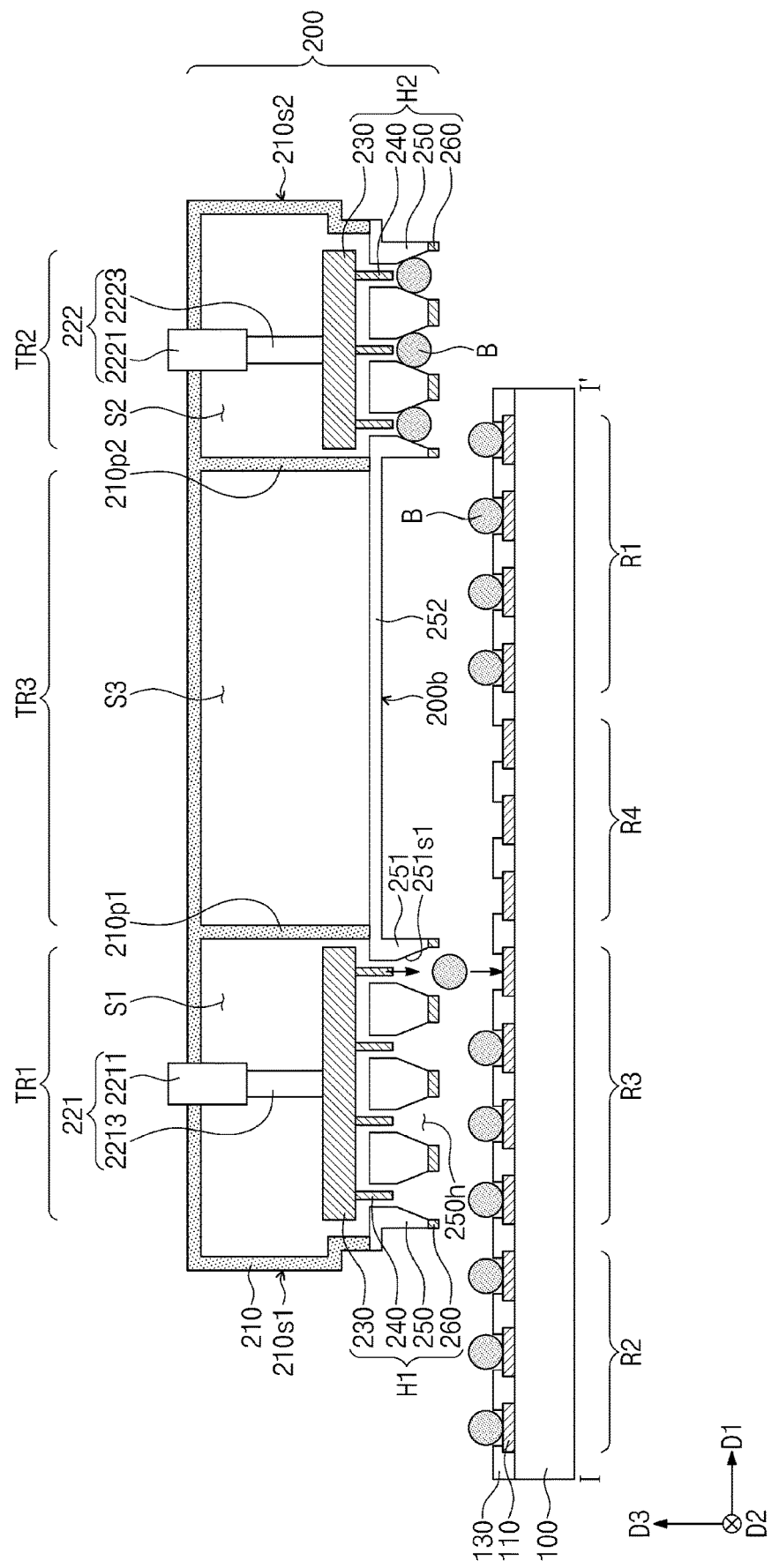

Referring to FIG. 5D, the third solder ball attaching process may be performed on the third working region R3 of the substrate 100. The third solder ball attaching process may include suctioning the solder balls B into the suction holes 250h, after the second solder ball attaching process, moving the ball tool 200 in the first direction D1 such that the first tool region TR1 of the ball tool 200 overlaps the third working region R3 of the substrate 100 in the third direction D3, and then, driving the first driving part 221 to move the pressing plate 230 and the pins 240 of the first holder H1 in a downward direction. Accordingly, the solder balls B may be attached to the pads 110 of the third working region R3.

During the third solder ball attaching process, the third tool region TR3 of the ball tool 200 and the second portion 252 of the suction plate 250 may overlap the fourth and first working regions R4 and R1 of the substrate 100 in the third direction D3. Due to the height difference HD between the bottom surfaces of the first and second portions 251 and 252 of the suction plate 250, the solder balls B, which were already attached to the first working region R1, may be spaced apart from the bottom surface 200b of the ball tool 200 in the third direction D3 and may not be affected by an approach of the ball tool 200 to the substrate 100 (e.g., the third working region R3). During the third solder ball attaching process, the third working region R3 may have a temperature different from the first, second, and fourth working regions R1, R2, and R4. For example, the temperature of the third working region R3 may be higher than temperatures of the first, second, and fourth working regions R1, R2, and R4.

Figure 5E:
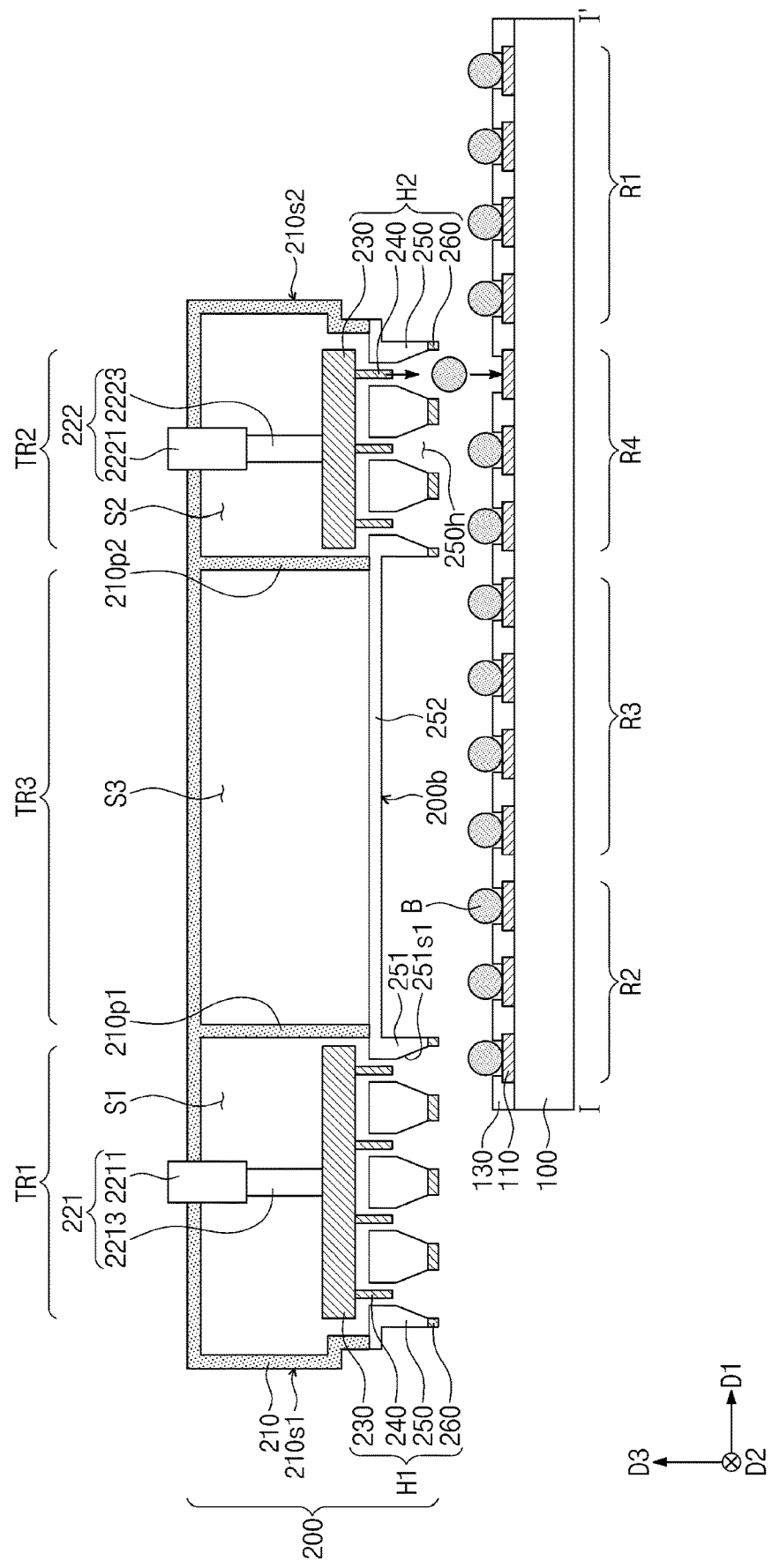

Referring to FIG. 5E, the fourth solder ball attaching process may be performed on the fourth working region R4 of the substrate 100. The fourth solder ball attaching process may include moving the ball tool 200 in the first direction D1 such that the second tool region TR2 of the ball tool 200 overlaps the fourth working region R4 in the third direction D3, after the third solder ball attaching process, and then, driving the second driving part 222 to move the pressing plate 230 and the pins 240 of the second holder H2 in a downward direction. Accordingly, the solder balls B may be attached to the pads 110 of the fourth working region R4.

During the fourth solder ball attaching process, the third tool region TR3 of the ball tool 200 and the second portion 252 of the suction plate 250 may overlap the third and second working regions R3 and R2 of the substrate 100 in the third direction D3. Due to the height difference HD between the bottom surfaces of the first and second portions 251 and 252 of the suction plate 250, the solder balls B, which were already attached to the second and third working regions R2 and R3, may be spaced apart from the bottom surface 200b of the ball tool 200 in the third direction D3 and may not be affected by an approach of the ball tool 200 to the substrate 100 (e.g., the fourth working region R4). During the fourth solder ball attaching process, the fourth working region R4 may have a temperature different from the first, second, and third working regions R1, R2, and R3. For example, the temperature of the fourth working region R4 may be higher than temperatures of the first, second, and third working regions R1, R2, and R3.

However, the number of the solder ball attaching processes, the number of the working regions, and the order of the process on the working regions are not limited to those in the embodiment described with reference to FIGS. 5A, 5B, 5C, 5D, and 5E and may be variously changed.

Figure 6A:
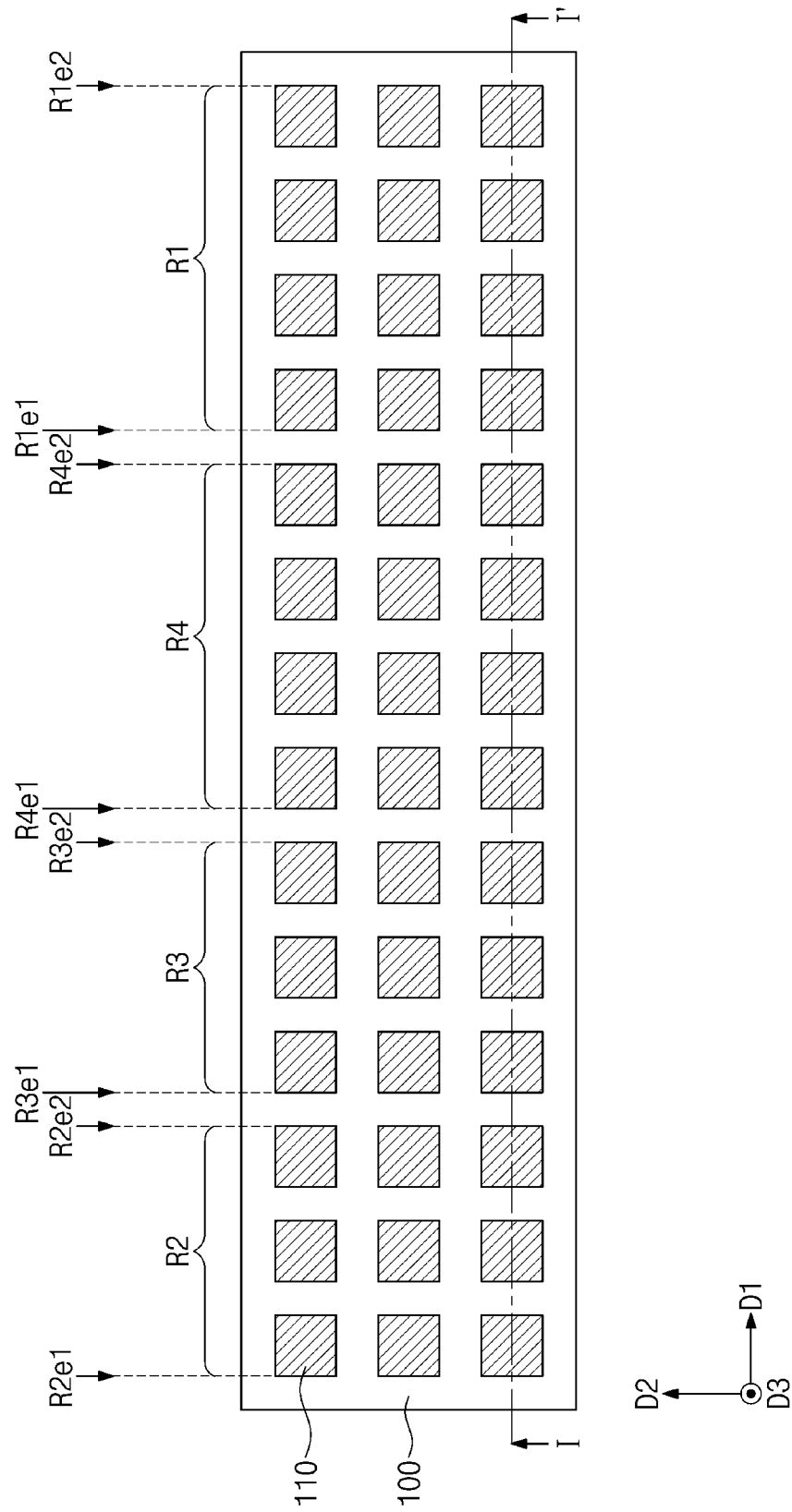
FIG. 6A is a plan view illustrating a substrate, which is used in a process of manufacturing a semiconductor package according to an embodiment of the inventive concept.
Figure 6B:
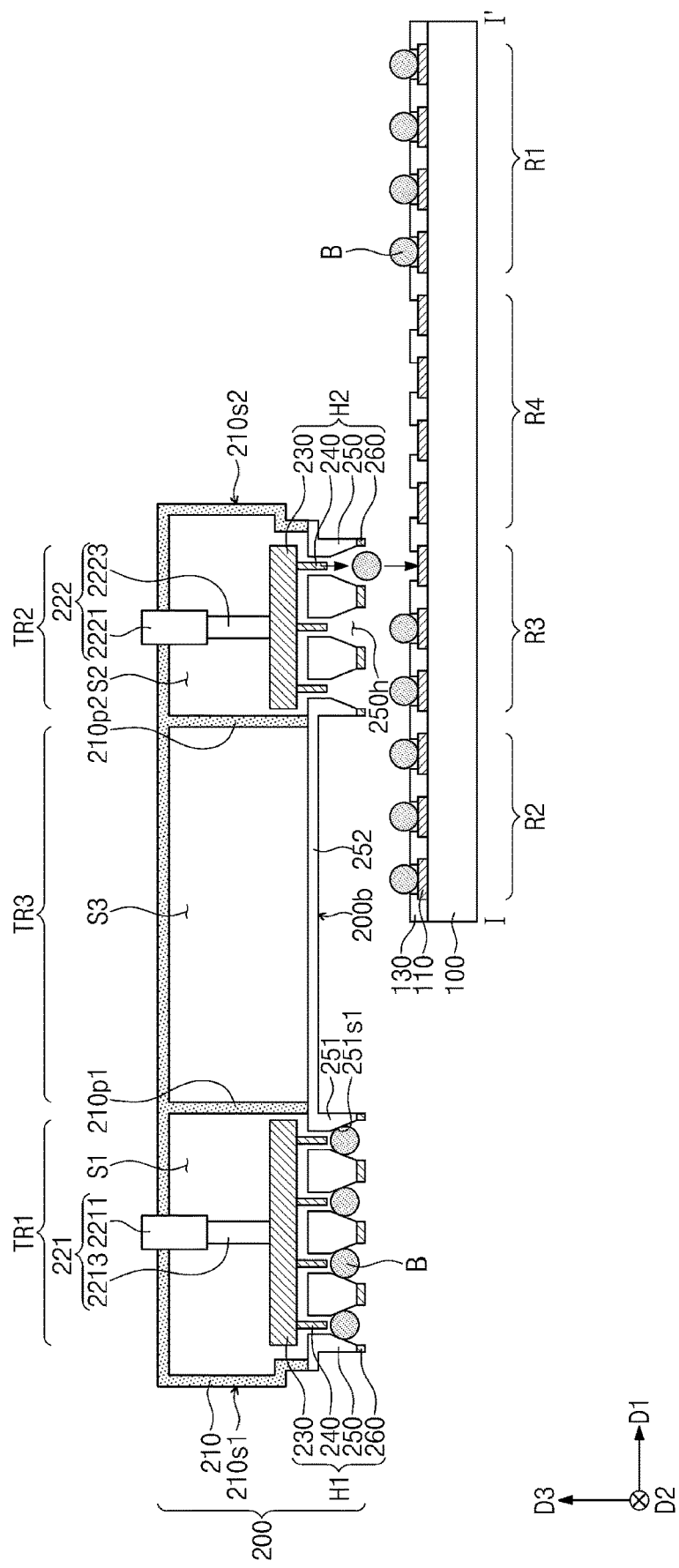
FIGS. 6B and 6C are sectional views illustrating a solder ball attaching process, which is performed as a part of a process of manufacturing a semiconductor package according to an embodiment of the inventive concept.
Figure 6C:
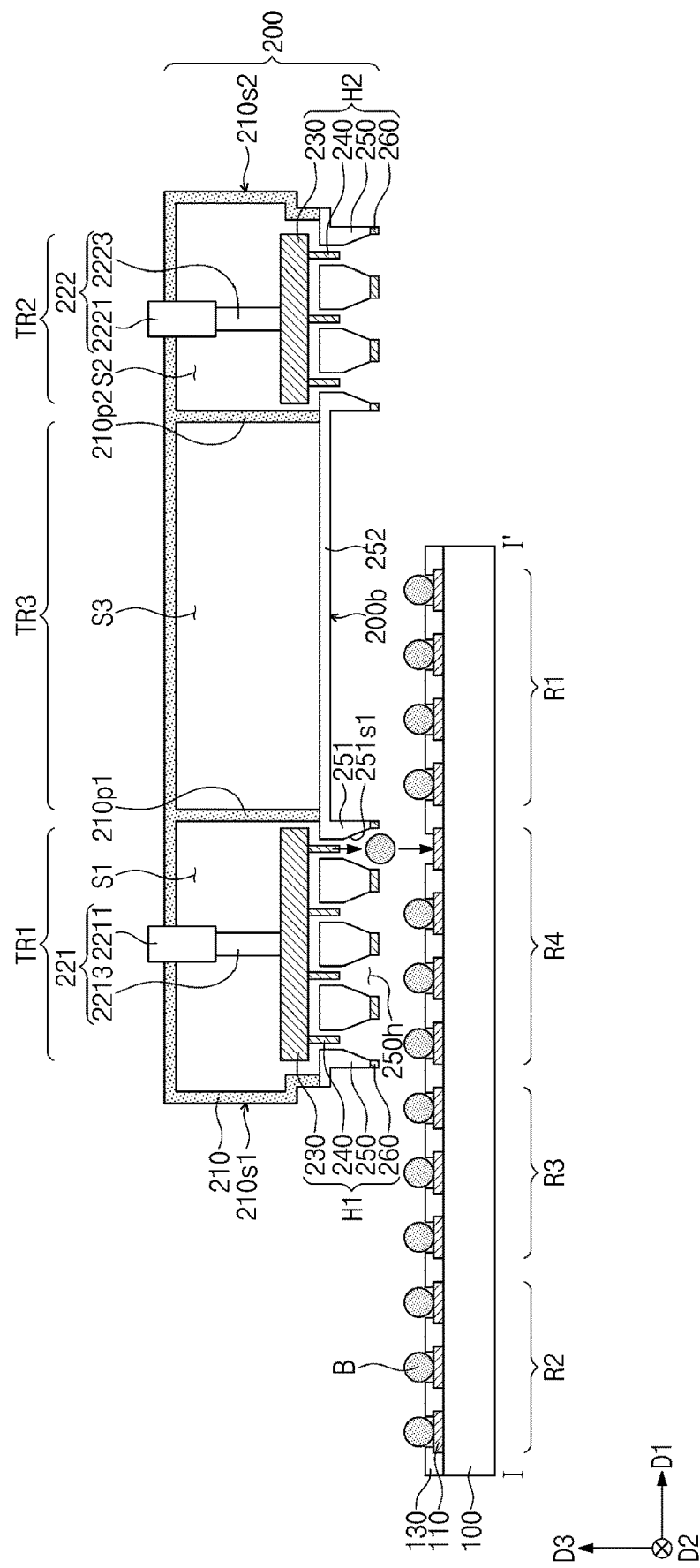

FIG. 6A is a plan view illustrating a substrate, which is used in a process of manufacturing a semiconductor package according to an embodiment of the inventive concept. FIGS. 6B and 6C are sectional views illustrating a solder ball attaching process, which is performed as a part of a process of manufacturing a semiconductor package according to an embodiment of the inventive concept.

Referring to FIG. 6A, according to the determination of the method for the solder ball attaching process (in S300 of FIG. 1B), the working regions of the substrate 100 may be determined. For example, the substrate 100 may include the first working region R1, the second working region R2, the third working region R3, and the fourth working region R4. The first and second working regions R1 and R2 may be spaced apart from each other in the first direction D1. The third working region R3 may be placed between the first and second working regions R1 and R2. The fourth working region R4 may be placed between the first and third working regions R1 and R3.

A width of the first working region R1 in the first direction D1 may be different from a width of the second working region R2 in the first direction D1. The width of the first working region R1 in the first direction D1 may be substantially equal to a width, in the first direction D1, of the fourth working region R4, which is adjacent to the first working region R1 in the first direction D1. The width of the second working region R2 in the first direction D1 may be substantially equal to a width, in the first direction D1, of the third working region R3, which is adjacent to the second working region R2 in the first direction D1.

Referring to FIG. 6B, the third solder ball attaching process may be performed on the third working region R3 of the substrate 100. The suctioning of the solder balls B into the suction holes 250h, the first solder ball attaching process on the first working region R1, and the second solder ball attaching process on the second working region R2 may be performed in the same manner as described with reference to FIGS. 5A, 5B, and 5C.

The third solder ball attaching process may include suctioning, after the second solder ball attaching process, the solder balls B into the suction holes 250h, moving the ball tool 200 in the first direction D1 such that the second tool region TR2 of the ball tool 200 overlaps the third working region R3 of the substrate 100 in the third direction D3, and then, driving the second driving part 222 to move the pressing plate 230 and the pins 240 of the second holder H2 in a downward direction. Accordingly, the solder balls B may be attached to the pads 110 of the third working region R3.

During the third solder ball attaching process, the third tool region TR3 of the ball tool 200 and the second portion 252 of the suction plate 250 may overlap the second working region R2 of the substrate 100 in the third direction D3. Here, due to the height difference HD between the bottom surfaces of the first and second portions 251 and 252 of the suction plate 250, the solder balls B, which were already attached to the second working region R2, may be spaced apart from the bottom surface 200b of the ball tool 200 in the third direction D3 and may not be affected by an approach of the ball tool 200 to the substrate 100 (e.g., the third working region R3). During the third solder ball attaching process, the third working region R3 may have a temperature different from the first, second, and fourth working regions R1, R2, and R4. For example, the temperature of the third working region R3 may be higher than temperatures of the first, second, and fourth working regions R1, R2, and R4.

Referring to FIG. 6C, the fourth solder ball attaching process may be performed on the fourth working region R4 of the substrate 100. The fourth solder ball attaching process may include moving, after the third solder ball attaching process, the ball tool 200 in the first direction D1 such that the first tool region TR1 of the ball tool 200 overlaps the fourth working region R4 in the third direction D3, and driving the first driving part 221 to move the pressing plate 230 and the pins 240 of the first holder H1 in a downward direction. Accordingly, the solder balls B may be attached to the pads 110 of the fourth working region R4.

During the fourth solder ball attaching process, the third tool region TR3 of the ball tool 200 and the second portion 252 of the suction plate 250 may overlap the first working region R1 of the substrate 100 in the third direction D3. Here, due to the height difference HD between the bottom surfaces of the first and second portions 251 and 252 of the suction plate 250, the solder balls B, which were already attached to the first working region R1, may be spaced apart from the bottom surface 200b of the ball tool 200 in the third direction D3 and may not be affected by an approach of the ball tool 200 to the substrate 100 (e.g., the fourth working region R4). During the fourth solder ball attaching process, the fourth working region R4 may have a temperature different from the first, second and third working regions R1, R2, and R3. For example, the temperature of the fourth working region R4 may be higher than temperatures of the first, second and third working regions R1, R2, and R3.

Referring to FIGS. 6B and 6C, it may be possible to reduce an overlapping area between the substrate 100 and the ball tool 200, which overlap each other in the third direction D3 during the third and fourth solder ball attaching processes, compared with the embodiment of FIGS. 5D and 5E.

In the semiconductor package manufacturing method according to an embodiment of the inventive concept, the error in the solder ball attaching process may be estimated to divide the substrate 100 into the working regions, the ball tool 200 may be manufactured based on the working regions determined based on the estimated error in the solder ball attaching process, and a plurality of solder ball attaching processes may be respectively performed on the divided working regions. Thus, each of the solder balls B may be precisely disposed on a center of a corresponding one of the pads 110 on the substrate 100, and it may be possible to prevent and/or minimize an alignment error between the solder balls and the pads. Accordingly, it may be possible to improve reliability and electrical characteristics of a semiconductor package.

In a method of manufacturing a semiconductor package according to an embodiment of the inventive concept, an error in a solder ball attaching process may be estimated to divide a substrate into working regions, a ball tool may be manufactured based on the working regions determined based on the estimated error in the solder ball attaching process, and a plurality of solder ball attaching processes may be respectively performed on the divided working regions. Thus, each of solder balls may be precisely disposed on a center of a corresponding one of pads on the substrate, and it may be possible to prevent and/or minimize an alignment error between the solder balls and the pads. Accordingly, it may be possible to improve reliability and electrical characteristics of a semiconductor package.

While example embodiments of the inventive concept have been particularly shown and described, it will be understood by one of ordinary skill in the art that variations in form and detail may be made therein without departing from the spirit and scope of the attached claims.

What is claimed is:

1. A method of manufacturing a semiconductor package, comprising:
    estimating an error in a solder ball attaching process;
    determining a specification of a ball tool and a method of the solder ball attaching process, based on the estimated error;
    manufacturing the ball tool according to the determined specification thereof; and
    performing the solder ball attaching process based on the method of the solder ball attaching process,
    wherein the determining of the specification of the ball tool and the method of the solder ball attaching process comprises:
        determining a number of a plurality of holders in the ball tool and a position and a width of each holder of the plurality of holders,
        determining a number of a plurality of working regions of a substrate and a position and a width of each working region of the plurality of working regions, and
        dividing the substrate into the plurality of working regions, and
    wherein the performing of the solder ball attaching process includes controlling independently a temperature of each working region of the plurality of working regions.

2. The method of claim 1,
    wherein the plurality of working regions of the substrate comprise a first working region and a second working region,
    wherein a width of the first working region is different from a width of the second working region, and
    wherein the ball tool comprises a first holder of a first tool region, which has the same width as the first working region, and a second holder of a second tool region, which has the same width as the second working region.

3. The method of claim 2,
    wherein the ball tool further comprises a third tool region between the first tool region and the second tool region,
    wherein each of the first holder and the second holder comprises a pressing plate, a plurality of pins below the pressing plate, and a suction plate having a plurality of suction holes, the plurality of pins moving through the plurality of suction holes, respectively,
    wherein the suction plate comprises a first portion in the first tool region, and a second portion extending from the first portion to the third tool region, and
    wherein a bottom surface of the first portion of the suction plate is located at a level different from a bottom surface of the second portion of the suction plate.

4. The method of claim 3,
    wherein a height difference between the bottom surface of the first portion of the suction plate and the bottom surface of the second portion of the suction plate is between 150 µm and 250 µm.

5. The method of claim 2,
    wherein the plurality of working regions of the substrate further comprise:
        a third working region between the first working region and the second working region, and
        a fourth working region between the third working region and the first working region,
    wherein the third working region has the same width as the first working region, and
    wherein the fourth working region has the same width as the second working region.

6. The method of claim 5,
    wherein the performing of the solder ball attaching process comprises:
        suctioning solder balls into the first holder and the second holder;
        moving the ball tool such that the first working region overlaps the first holder;
        performing a first solder ball attaching process on the first working region;

moving the ball tool such that the second working region overlaps the second holder;
performing a second solder ball attaching process on the second working region;
suctioning solder balls into the first holder and the second holders again;
moving the ball tool such that the third working region overlaps the first holder;
performing a third solder ball attaching process on the third working region;
moving the ball tool such that the fourth working region overlaps the second holder; and
performing a fourth solder ball attaching process on the fourth working region.

7. The method of claim 6,
wherein, during the first solder ball attaching process, the first working region has a temperature different from the second working region, the third working region, and the fourth working region,
wherein, during the second solder ball attaching process, the second working region has a temperature different from the first working region, the third working region, and the fourth working region,
wherein, during the third solder ball attaching process, the third working region has a temperature different from the first working region, the second working region, and the fourth working region, and
wherein, during the fourth solder ball attaching process, the fourth working region has a temperature different from the first working region, the second working region, and the third working region.

8. The method of claim 2,
wherein the plurality of working regions of the substrate further comprise a third working region between the first working region and the second working region and a fourth working region between the third working region and the first working region,
wherein the third working region has the same width as the second working region, and
wherein the fourth working region has the same width as the first working region.

9. The method of claim 1,
wherein the estimated error in the solder ball attaching process comprises a misalignment between the substrate and the ball tool, which is caused by an expansion/contraction of the substrate and a driving error of the ball tool.

10. The method of claim 1,
wherein the number of the plurality of holders is smaller than or equal to the number of the plurality of working regions.

11. The method of claim 10,
wherein the number of the plurality of holders is a value that is obtained by dividing the number of the plurality of working regions by an integer that is equal to or greater than 2.

12. The method of claim 1, further comprising:
evaluating the ball tool, after finishing the solder ball attaching process,
wherein a result, which is obtained through the evaluating of the ball tool, is used to estimate an error in a subsequent solder ball attaching process to be performed on another substrate.

13. The method of claim 1, further comprising:
recognizing each of end portions of the plurality of working regions using a pattern recognition system, before the determining of the specification of the ball tool and the method of the solder ball attaching process.

14. A method of manufacturing a semiconductor package, comprising:
mounting a semiconductor chip on a first surface of a substrate;
forming a plurality of pads on a second surface of the substrate opposite to the first surface; and
forming a plurality of solder balls on the plurality of pads, respectively,
wherein the forming of the plurality of solder balls comprises:
estimating an error in a solder ball attaching process;
determining a specification of a ball tool and a method of the solder ball attaching process, based on the estimated error;
manufacturing the ball tool;
performing the solder ball attaching process; and
evaluating the ball tool,
wherein according to the determining of the specification of the ball tool and the method of the solder ball attaching process, the substrate is divided into a first working region and a second working region, and the ball tool comprises a first holder on a first tool region corresponding to the first working region, and a second holder on a second tool region corresponding to the second working region, and
wherein the estimating of the error in the solder ball attaching process comprises:
calculating a first error, which is a tolerance in position of a solder ball;
calculating a second error, which is a mean value of an offset between a sidewall of the substrate and a sidewall of the ball tool; and
calculating a third error, which is a misalignment value between the substrate and the ball tool, which is caused by a driving error of the ball tool.

15. The method of claim 14, further comprising:
dividing the substrate into the first working region and the second working region, when the first error is smaller than or equal to a sum of the second error and the third error.

16. The method of claim 14,
wherein a number of performing the solder ball attaching process is a truncated integer value of (an expectation value of expansion/contraction of the substrate)/(the first error).

17. The method of claim 14, further comprising:
storing data of an evaluation result obtained from the evaluating the ball tool in a server,
wherein the data stored in the server are used to determine a method of a subsequent solder ball attaching process to be performed on another substrate.

18. The method of claim 14,
wherein the substrate further comprises:
a third working region between the first working region and the second working region and a fourth working region between the third working region and the first working region,
wherein the third working region has the same width as the first working region, and
wherein the fourth working region has the same width as the second working region.

19. The method of claim 14,
wherein the substrate further comprises a third working region between the first working region and the second working region and a fourth working region between the third working region and the first working region, wherein the third working region has the same width as the second working region, and wherein the fourth working region has the same width as the first working region.

\* \* \* \* \*